US012811093B2

(12) United States Patent
Kozuka

(10) Patent No.: US 12,811,093 B2
(45) Date of Patent: Nov. 24, 2026

(54) SAMPLE MILLING SYSTEM AND APPARATUS AND METHOD FOR IMAGE GENERATION

(71) Applicant: JEOL Ltd., Tokyo (JP)

(72) Inventor: Munehiro Kozuka, Tokyo (JP)

(73) Assignee: JEOL Ltd., Tokyo (JP)

( * ) Notice: Subject to any disclaimer, the term of this patent is extended or adjusted under 35 U.S.C. 154(b) by 279 days.

(21) Appl. No.: 18/757,874

(22) Filed: Jun. 28, 2024

(65) Prior Publication Data

US 2025/0006458 A1 Jan. 2, 2025

(30) Foreign Application Priority Data

Jun. 30, 2023 (JP) ................................ 2023-108324

(51) Int. Cl.
*H01J 37/302* (2006.01)
*H01J 37/20* (2006.01)
*H01J 37/305* (2006.01)

(52) U.S. Cl.
CPC .......... *H01J 37/3023* (2013.01); *H01J 37/20* (2013.01); *H01J 37/305* (2013.01); *H01J 2237/20207* (2013.01); *H01J 2237/20214* (2013.01)

(58) Field of Classification Search
CPC ...... H01J 37/3023; H01J 37/20; H01J 37/305; H01J 2237/20207; H01J 2237/20214; H01J 37/3056; H01J 37/222; H01J 37/08; G01N 1/32; G06T 11/26
See application file for complete search history.

(56) References Cited

U.S. PATENT DOCUMENTS 7,322,098 B2 * 1/2008 Buitron .................... G11B 5/84 414/811
8,909,588 B2 * 12/2014 Aristoff .................... G06N 5/02 706/52
9,411,914 B2 * 8/2016 Kuboi ..................... G06F 30/20
9,620,338 B2 * 4/2017 Samukawa ............ G01N 21/67
11,017,987 B2 * 5/2021 Fukasawa ......... H01J 37/32926
11,347,150 B2 * 5/2022 Tel ...................... G03F 7/70441
2006/0189255 A1 * 8/2006 Akiyama ................ B24B 9/148 451/240
(Continued)

FOREIGN PATENT DOCUMENTS

DE 102013011674 A1 * 1/2015 ............ G01N 23/04
JP H0336285 A 2/1991
(Continued)

OTHER PUBLICATIONS

European Search Report issued in EP24180863.3 on Nov. 13, 2024.
Office Action issued in JP2023108324 on Apr. 22, 2025.

*Primary Examiner* — David A Vanore
(74) *Attorney, Agent, or Firm* — The Webb Law Firm

(57) ABSTRACT

There is provided a sample milling system permitting one to determine suitable milling process conditions easily. The sample milling system includes: a sample milling apparatus for milling a sample by making an ion beam impinge on the sample; and an image generator apparatus for generating forecasted imagery for a case where the sample is milled using the milling apparatus under preset milling process conditions. The forecasted imagery contains information about a distribution of directions of impingement of the ion beam.

13 Claims, 24 Drawing Sheets

(56) References Cited

U.S. PATENT DOCUMENTS

| | | | | |
|---|---|---|---|---|
| 2010/0084584 | A1 * | 4/2010 | Hino | H01J 37/20 250/492.21 |
| 2010/0243431 | A1 * | 9/2010 | Kuboi | C23C 14/48 702/181 |
| 2013/0220806 | A1 * | 8/2013 | Iwaya | H01J 37/20 204/298.36 |
| 2013/0344339 | A1 * | 12/2013 | Kuboi | C23C 14/48 156/345.24 |
| 2015/0311028 | A1 * | 10/2015 | Negishi | H01J 37/08 250/492.3 |
| 2018/0158646 | A1 * | 6/2018 | Nakamura | H01J 37/28 |
| 2021/0066024 | A1 * | 3/2021 | Kikuchi | H01J 37/28 |
| 2022/0262593 | A1 * | 8/2022 | Fischione | H01J 37/147 |
| 2022/0277925 | A1 * | 9/2022 | Kataoka | H01J 37/3053 |
| 2022/0285125 | A1 | 9/2022 | Kozuka | |
| 2023/0197401 | A1 * | 6/2023 | Kozuka | H01J 37/305 250/396 R |
| 2025/0006458 | A1 * | 1/2025 | Kozuka | G01N 1/32 |

FOREIGN PATENT DOCUMENTS

| | | | | |
|---|---|---|---|---|
| JP | 2010232594 | A | 10/2010 | |
| JP | 4851804 | B2 * | 1/2012 | H01J 37/3056 |
| JP | 2025007129 | A * | 1/2025 | G06T 11/26 |
| KR | 20250003298 | A * | 1/2025 | G06T 11/26 |
| WO | WO-2015077400 | A1 * | 5/2015 | H01J 37/3171 |
| WO | 2024142316 | A1 | 7/2024 | |

* cited by examiner

SAMPLE MILLING SYSTEM AND APPARATUS AND METHOD FOR IMAGE GENERATION

CROSS REFERENCE TO RELATED APPLICATION

This application claims priority to Japanese Patent Application No. 2023-108324, filed Jun. 30, 2023, the disclosure of which is hereby incorporated by reference in its entirety.

BACKGROUND OF THE INVENTION

1. Field of the Invention

The present invention relates to a sample milling system and also to an apparatus and method for image generation.

2. Description of the Related Art

Cross Section Polisher (a trademark registered) is known as an apparatus for milling a sample using an ion beam. As a milling method using such a sample milling apparatus, a planar milling method is known which forms a smooth, flat plane by making use of sputtering occurring when an ion beam is made to impinge at a quite small tilt angle on the sample surface.

For example, JP-A-3-36285 discloses an ion milling apparatus consisting of an ion gun for irradiating a rotating sample with an ion beam and a sample rotating mechanism for placing the sample in position and rotating it so that the center of rotation of the sample lies within the surface irradiated by the ion beam. On the sample surface, the center of rotation of the sample deviates a given distance from the position of the center of the ion beam. Because the center of the ion beam and the center of rotation of the sample are out of coincidence in this way, a wider area on the sample can be irradiated with an ion beam from various directions as compared with the case where the center of the beam and the center of rotation of the sample are in coincidence. Consequently, the wider area on the sample can be smoothly etched.

However, during milling, the direction of impingement of the ion beam varies in a complex manner depending on the milling conditions including the rotational speed of the sample and the distance between the center of the ion beam and the center of rotation of the sample. This makes it difficult to determine suitable milling process conditions.

SUMMARY OF THE INVENTION

One aspect of the sample milling system associated with the present invention includes: a sample milling apparatus for milling a sample by making an ion beam impinge on the sample; and an image generator apparatus for generating forecasted imagery for a case where the sample is milled using the sample milling apparatus under preset milling process conditions. The forecasted imagery contains information about a distribution of directions of impingement of the ion beam.

With this sample milling system, forecasted imagery is obtained for a case where the sample is milled under the preset milling process conditions and, therefore, suitable milling process conditions can be determined easily.

One aspect of the image generator apparatus associated with the present invention includes: an image generator section for generating forecasted imagery for a case where a sample is milled under preset milling process conditions by the use of a sample milling apparatus that mills the sample by making an ion beam impinge on the sample; and a display controller for displaying the forecasted imagery that contains information about a distribution of directions of impingement of the ion beam.

With this image generator apparatus, it is possible to generate forecasted imagery for a case where the sample is milled under preset milling process conditions and so suitable milling process conditions can be determined easily.

One aspect of the method of image generation associated with the present invention involves the steps of: generating forecasted imagery for a case where a sample is milled under preset milling process conditions using a sample milling apparatus that mills the sample by making an ion beam impinge on the sample; and displaying the forecasted imagery that contains information about a distribution of directions of impingement of the ion beam.

In this method of image generation, it is possible to generate forecasted imagery for a case where the sample is milled under preset milling process conditions and, therefore, suitable milling process conditions can be determined easily.

DESCRIPTION OF THE INVENTION

The preferred embodiments of the present invention are hereinafter described in detail with reference to the drawings. Note that the embodiments provided below are not intended to unduly restrict the contents of the present invention delineated by the claims and that not all the configurations set forth below are essential constituents of the present invention.

1. First Embodiment

1.1. Sample Milling System

Figure 1:
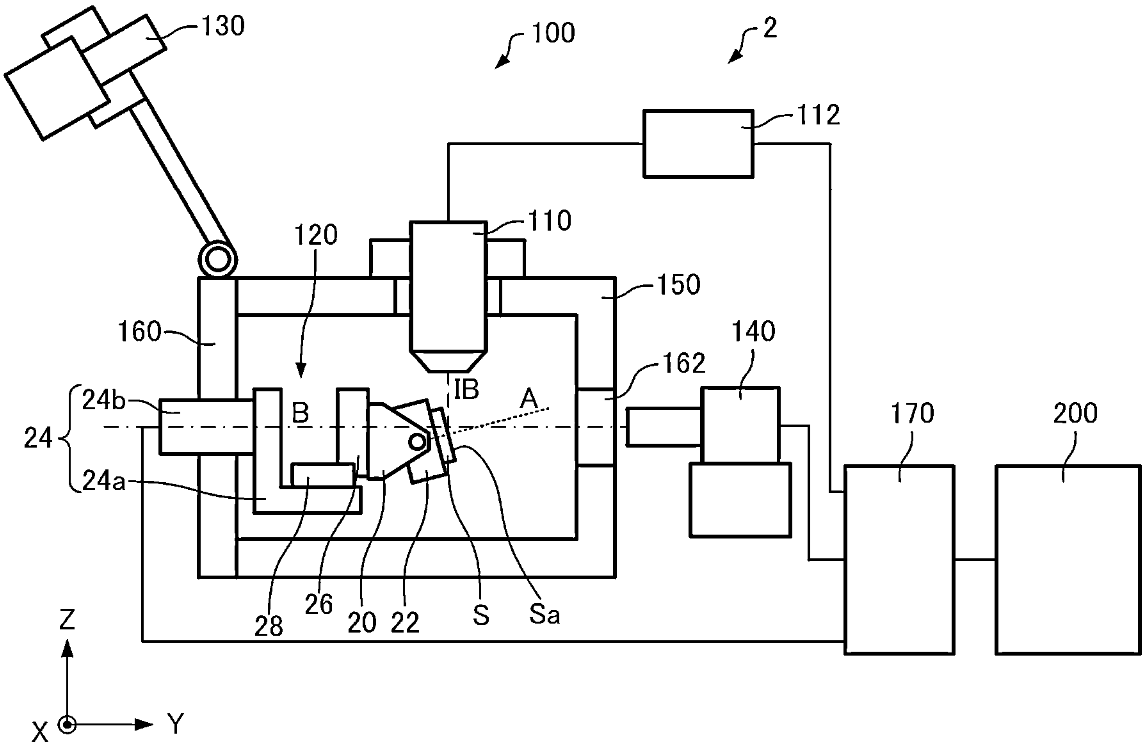
FIGS. 1 and 2 are diagrams showing the configuration of a sample milling system associated with a first embodiment of the present invention, illustrating different operational states.
Figure 2:
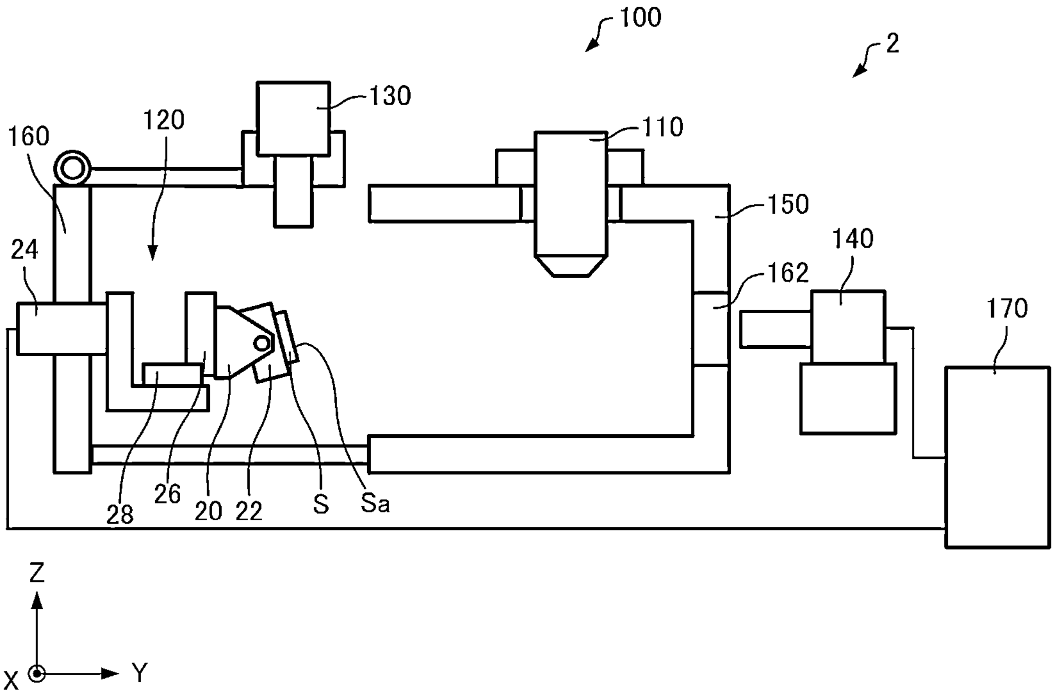

A sample milling system associated with a first embodiment of the present invention is first described by referring to FIGS. 1 and 2, which show the configuration of this sample milling system, 2.

In FIGS. 1 and 2, X, Y, and Z axes are shown as three axes perpendicular to each other. An X direction includes both +X direction running in one direction along the X axis and −X direction running in the other direction along the X axis. A Y direction includes both +Y direction going in one direction along the Y axis and −Y direction going in the other direction along the Y axis. A Z direction includes both +Z direction lying in one direction along the Z axis and −Z direction lying in the other direction along the Z axis.

Referring still to FIGS. 1 and 2, the sample milling system 2 includes a sample milling apparatus 100 and an image generator apparatus 200, it being noted that the apparatus 200 is omitted from being shown in FIG. 2 for the sake of convenience.

(1) Sample Milling Apparatus

The sample milling apparatus 100 mills a sample S by making an ion beam IB impinge on the sample S. The sample milling apparatus 100 is used to prepare a sample for an electron microscope, for example, such as a scanning electron microscope (SEM), a transmission electron microscope (TEM), or a scanning transmission electron microscope (STEM). The sample milling apparatus 100 is also used to prepare a sample for an analytical instrument other than electron microscopes, for example, such as an electron probe microanalyzer (EPMA) or an Auger microprobe.

The sample milling apparatus 100 can mill the sample S by planar milling technology, i.e., a flat and smooth surface is produced by making use of sputtering occurring when the ion beam IB is directed at the surface of the sample S at a quite shallow angle. This milling operation is described in detail below.

Referring still to FIGS. 1 and 2, the sample milling apparatus 100 includes an ion source 110, a sample stage assembly 120, a positioning camera 130, a milling observation camera 140, a vacuum chamber 150, a chamber door 160, and a controller 170. FIG. 1 shows a state in which the chamber door 160 is closed and the sample stage assembly 120 has been pushed into the vacuum chamber 150. FIG. 2 shows a state in which the chamber door 160 is opened and the sample stage assembly 120 has been pulled out of the chamber 150.

The ion source 110 produces the ion beam IB and directs it toward the sample S, thus irradiating the sample S. The ion source 110 is mounted at the top of the vacuum chamber 150.

The sample stage assembly 120 mechanically supports the sample S and includes a tilt mechanism 20, a rotary mechanism 22, a swing mechanism 24, a Z stage 26, and an XY stage 28. The swing mechanism 24 has a swing table **24*a* on which the XY stage 28 is placed in the example of FIGS. 1 and 2. The Z stage 26 is placed on the XY stage 28. The tilt mechanism 20 is attached to the Z stage 26 and permits the rotary mechanism 22 to be supported tiltably. The sample S is attached to the rotary mechanism 22**.

Figure 3:
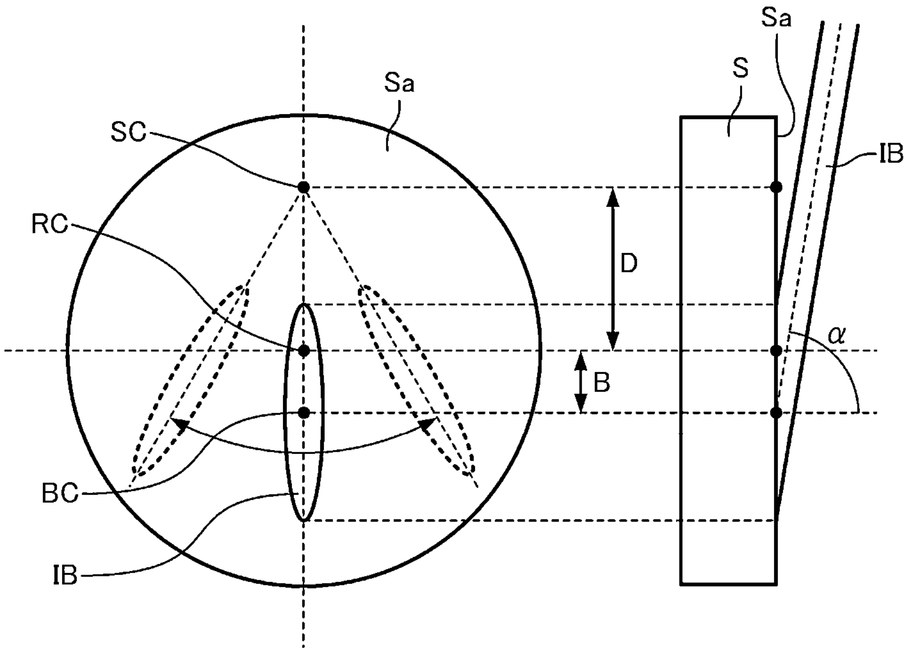
FIG. 3 schematically illustrates a sample supported on a sample stage assembly.

FIG. 3 schematically shows the manner in which the sample S is supported on the sample stage assembly 120. FIG. 3 includes a plan view of a surface Sa of the sample S and a cross section through the center of the sample S.

The tilt mechanism 20 operates to tilt the sample S so that the angle of impingement (incident angle) a of the ion beam IB relative to the surface Sa of the sample S can be adjusted. The tilt mechanism 20 tilts the sample S by tilting the rotary mechanism 22 and includes a shaft member tiltably supporting the rotary mechanism 22 and a support portion mechanically supporting the shaft member. Alternatively, the tilt mechanism 20 may tilt the sample S by means of a drive mechanism such as an electric motor.

The rotary mechanism 22 rotates the sample S about an axis of rotation A that is perpendicular to the surface Sa of the sample S. When the rotary mechanism 22 is tilted by the tilt mechanism 20, the axis of rotation A also tilts. Therefore, the axis of rotation A remains perpendicular to the surface Sa of the sample S if the sample S is tilted by the tilt mechanism 20. The center of rotation RC of the sample S when it is rotated by the rotary mechanism 22 is at the position of the intersection of the surface Sa of the sample S and the axis of rotation A. The rotary mechanism 22 includes a sample stage to which the sample S is secured and a drive mechanism for rotating the sample stage such as an electric motor.

The swing mechanism 24 swings the sample S, i.e., reciprocates it on the circumference of a circle. The swing mechanism 24 swings the tilt mechanism 20, the rotary mechanism 22, the Z stage 26, and the XY stage 28 together about an axis B (FIG. 1) that is parallel to the Y axis. The center of swing SC of the sample S lies at the position of the intersection of the surface Sa of the sample S and the axis B. The center of swing SC can be placed at an arbitrary position on the surface Sa of the sample S. The position of the center of swing SC can be moved by moving the sample S by the Z stage 26 or XY stage 28. The swing mechanism 24 includes the swing table **24*a* and a driver device 24*b* such as an electric motor for swinging the swing table 24*a***.

The Z stage 26 moves the sample S in the Z direction, so that the position of the sample S taken in the Z direction, i.e., the height of the sample S, can be adjusted. The Z stage 26 moves the sample S in the Z direction by moving the tilt mechanism 20 in the Z direction. The Z stage 26 moves the tilt mechanism 20 and the rotary mechanism 22 together in the Z direction. The distance D between the center of rotation RC and the center of swing SC can be adjusted by moving the sample S in the Z direction via the Z stage 26. That is, in the sample milling apparatus 100, the center-to-center distance D is variable. The Z stage 26 moves the sample S in the Z direction by means of a drive mechanism such as an electric motor. Alternatively, the sample S may be moved in the Z direction by manually operating the Z stage 26.

The XY stage 28 moves the sample S in the X direction and Y direction, whereby the positions of the sample S as taken in the X and Y directions can be adjusted. The XY stage 28 moves the sample S in the X and Y directions by moving the Z stage 26 in the X and Y directions. The XY stage 28 moves the tilt mechanism 20, the rotary mechanism 22, and the Z stage 26 together. The XY stage 28 permits adjustment of the eccentric distance B (FIG. 3) between the center BC of the ion beam IB and the center of rotation RC. That is, in the sample milling apparatus 100, the eccentric distance B is variable. The XY stage 28 moves the sample S in the X and Y directions by means of a drive mechanism such as an electric motor. Alternatively, the sample S may be moved in the X and Y directions by manually operating the XY stage 28.

The positioning camera 130 is used to determine the position of the optical axis of the ion beam IB. For example, when the chamber door 160 is open and the sample stage assembly 120 has been pulled out of the vacuum chamber 150, if the chamber door 160 is closed and the sample stage assembly 120 is pushed into the chamber 150, then the center of the field of view of the positioning camera 130 coincides with the position of the optical axis of the ion beam IB. When the chamber door 160 is closed, the positioning camera 130 is retracted away from the ion source 110.

The milling observation camera 140 is used to observe the sample S during milling. The optical axis of the observation camera 140 is parallel to the Y axis and disposed outside the vacuum chamber 150. The observation camera 140 permits observation of the sample S located within the chamber 150 through an observation window 162 formed in the chamber 150.

The sample stage assembly 120 is accommodated in the vacuum chamber 150. In the sample milling apparatus 100, the sample S is irradiated with the ion beam IB within the vacuum chamber 150. The interior of the vacuum chamber 150 can be maintained in a subatmospheric state by a vacuum pump (not shown).

The chamber door 160 hermetically seals off the vacuum chamber 150. The sample stage assembly 120 is mounted to the chamber door 160, which in turn is slidable relative to the chamber 150. The chamber door 160 can be opened and closed by sliding the chamber door 160. Therefore, the sample stage assembly 120 can be either pushed into the chamber 150 after closing the chamber door 160 or pulled out of the chamber 150 after opening the chamber door 160.

The controller 170 controls the various parts of the sample milling apparatus 100. The controller 170 controls the ion source 110, for example, via an ion source control circuit 112 which converts a control signal from the controller 170 into a drive signal for driving the ion source 110 and outputs the drive signal to the ion source 110. Furthermore, the controller 170 controls other component such as the sample stage assembly 120. If the user sets milling process conditions, the controller 170 operates the ion source 110 and the sample stage assembly 120 according to the set milling process conditions.

When the sample S is planar milled using the sample milling apparatus 100, milling process conditions are set which include the energy of the ion beam IB (accelerating voltage of the ion beam), the angle of impingement α of the ion beam IB, the rotational speed of the sample S, the angular range of swing of the sample S, the speed of swing of the sample S, the eccentric distance B between the center of rotation RC of the sample S and the center BC of the ion beam IB, the distance D between the center of rotation RC and the center of swing SC of the sample S, and the milling process time.

In the sample milling apparatus 100, if the milling process conditions are set, the controller 170 controls the ion source 110 and the sample stage assembly 120 according to the milling process conditions. In particular, the controller 170 controls the accelerating voltage at the ion source 110 according to the set energy of the ion beam IB. Also, the controller 170 controls the tilt mechanism 20 according to the set angle of impingement α of the ion beam IB. Furthermore, the controller 170 controls the rotary mechanism 22 according to the set rotational speed. In addition, the controller 170 controls the swing mechanism 24 according to the set angular range and speed of swing. Moreover, the controller 170 controls the XY stage 28 according to the set distance B between the center of rotation RC of the sample S and the center BC of the ion beam IB. Additionally, the controller 170 controls the Z stage 26 according to the set distance D between the center of rotation RC and the center of swing SC of the sample S.

As a result, in the sample milling apparatus 100, the distance B between the center of rotation RC of the sample S and the center BC of the ion beam IB becomes equal to the preset distance. Also, the distance D between the center of rotation RC and the center of swing SC of the sample S becomes equal to the preset distance. Furthermore, the tilt angle of the sample S becomes equal to the set angle of impingement α, i.e., the angle at which the ion beam IB impinges on the surface Sa of the sample S. The ion beam IB from the ion source 110 hits the sample S with the set energy (accelerating voltage). The ion beam IB is incident on the surface Sa of the sample S at the set angle of impingement α. At this time, the sample S rotates at the set rotational speed about the center of rotation RC and swings at the set swing speed through the set angular range about the center of swing SC. The controller 170 causes the ion beam IB to be emitted only during the milling time set into the ion source 110. Consequently, the sample S can be milled under the preset milling process conditions.

The tilt angle of the sample S, the distance B between the center of rotation RC of the sample S and the center BC of the ion beam IB, the distance D between the center of rotation RC and the center of swing SC of the sample S, and other parameters may be adjusted by a human operator by manually operating the sample stage assembly 120.

(2) Image Generator Apparatus

Figure 4:
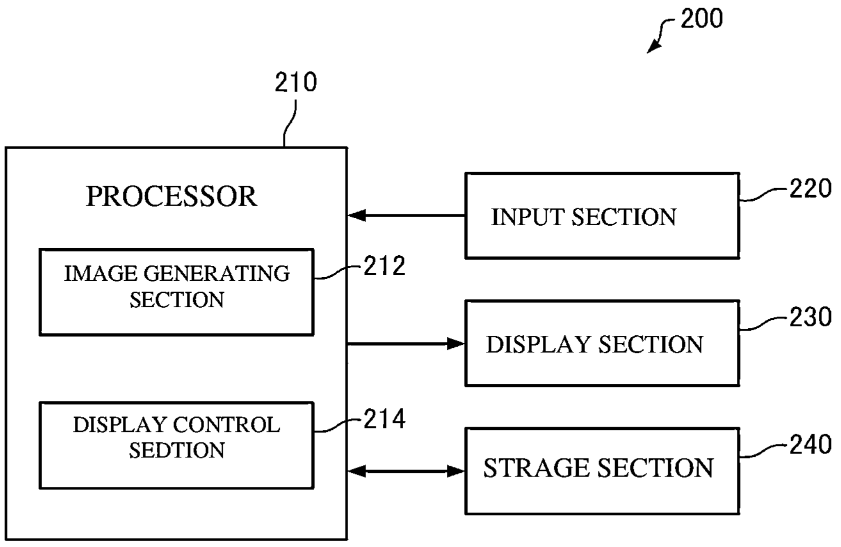
FIG. 4 is a block diagram of an image generator apparatus.

FIG. 4 shows the configuration of the image generator apparatus 200 including a processor 210, an input section 220, a display section 230, and a storage section 240 as shown. The input section 220 permits a user to enter control information and outputs the entered control information to the processor 210. The functions of the input section 220 can be realized by an input device such as a keyboard, a mouse, buttons, or a touch panel.

The display section 230 displays the image created by the processor 210. The function of the display section 230 can be realized by a liquid crystal display (LCD), a touch panel acting also as the input section 220, or the like.

Programs and various kinds of data permitting a computer to operate as various portions of the processor 210 are stored in the storage section 240. The storage section 240 functions also as a working area for the processor 210. The function of the storage section 240 can be realized by a hard disk, a RAM (random access memory), or the like.

The functions of the processor 210 can be accomplished by executing computer programs with hardware devices including various processors (such as a CPU and a DSP (digital signal processor)). The processor 210 includes an image generating section 212 and a display control section 214.

The image generating section 212 generates forecasted imagery for a case where the sample S is milled under preset milling process conditions using the sample milling apparatus 100. The forecasted imagery contains information about the intensity of impingement of the ion beam IB in a case where the sample S is milled under the preset milling process conditions and information about the direction of the impingement of the ion beam IB. That is, it is known, from the forecasted imagery, as to what position on the sample S was hit by the ion beam IB, what intensity did the beam IB have, and from what direction did the beam arrive. The image generating section 212 performs simulations based on the preset milling process conditions and creates forecasted imagery.

The forecasted imagery created by the image generating section 212 is displayed on the display section 230 under the control of the display control section 214.

1.2. Method of Image Generation

Figure 5:
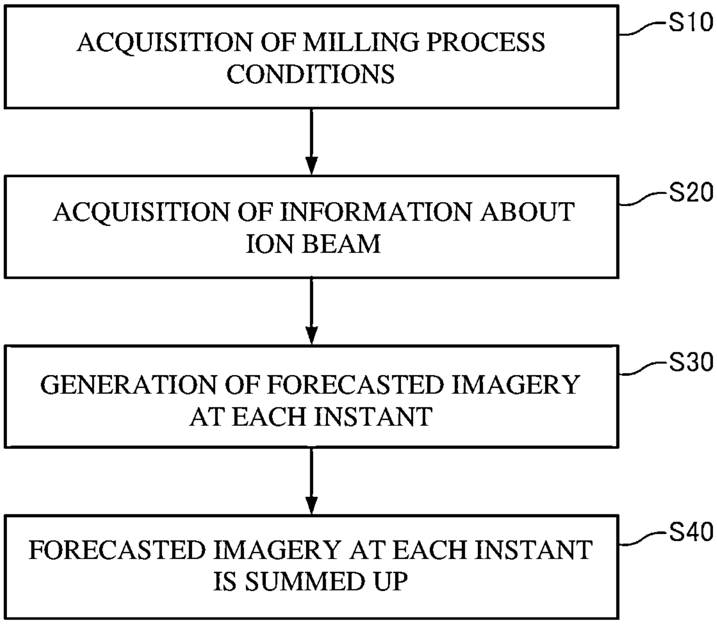
FIG. 5 is a flowchart illustrating one example of image generation method for generating forecasted imagery.

A method of generating forecasted imagery is next described. FIG. 5 is a flowchart illustrating one example of the method of generation of the forecasted imagery.

1.2.1. Step of Acquiring Milling Process Conditions (S10)

First, the image generating section 212 acquires information about milling process conditions. For this purpose, the image generating section 212 accepts information about the milling process conditions which have been entered by the user via the input section 220.

Figure 6:
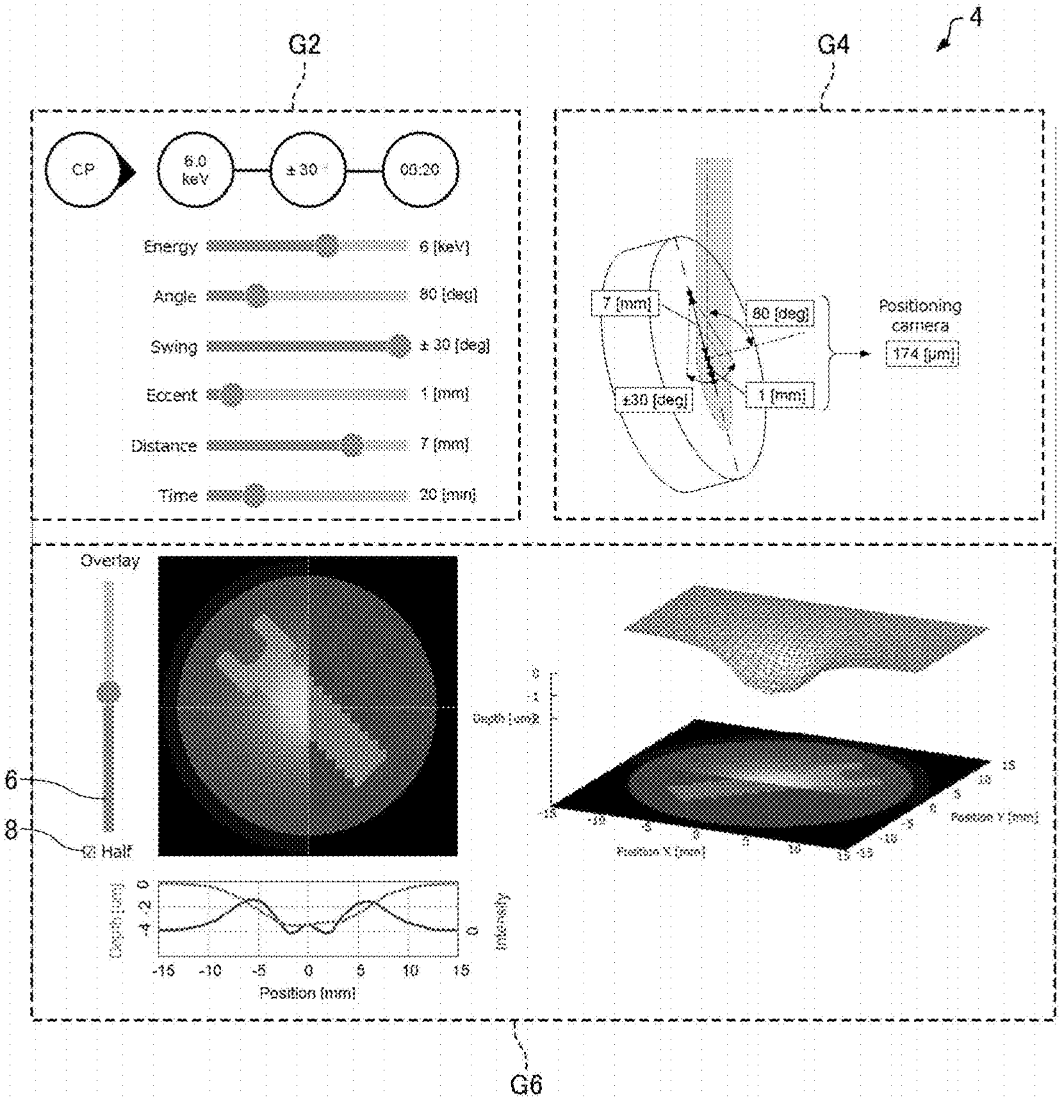
FIG. 6 is a schematic representation of one example of GUI of the image generator apparatus.

FIG. 6 schematically illustrates one example of a GUI (graphical user interface) screen 4 of the image generator apparatus 200. The GUI screen 4 contains a milling process condition setting section G2 for setting milling process conditions, a sample image display section G4 for illustrating the positional relationship between the sample S and the ion beam IB by visualizing the milling process conditions, and forecasted imagery display section G6 for displaying the generated, forecasted imagery.

Slider objects are arranged in the milling process condition setting section G2 to set various parameters of the milling process conditions. The slider objects include a slider object for setting the energy of the ion beam IB, a slider object for setting the angle of impingement α of the ion beam IB, a slider object for setting the angular range of swing of the sample S, an eccentricity setting slider object for setting the eccentric distance B between the center of rotation RC of the sample S and the center BC of the ion beam IB, a slider object for setting the distance D between the center of rotation RC and the center of swing SC of the sample S, and a slider object for setting a milling time. A further slider object (not shown) for setting the swing speed of the sample S may be positioned in the milling process condition setting section G2.

The GUI elements for setting parameters are not restricted to slider objects or slider widgets. An input field for directly entering the numerical values of parameters, for example, may be positioned in the milling process condition setting section G2.

The milling process condition setting section G2 is displayed in the same manner, for example, as the GUI for setting the milling process conditions in the sample milling apparatus 100. Therefore, after checking the forecasted imagery generated by the image generator apparatus 200 and determining the milling process conditions, an operation for entering various parameters into the GUI of the sample milling apparatus 100 can be carried out with ease.

An image of the sample S which complies with the set milling process conditions is displayed on the sample image display section G4. In particular, an image of the sample S is displayed in such a way that the tilt angle of the sample S (angle of impingement of the ion beam IB), the eccentric distance B between the center of rotation RC of the sample S and the center BC of the ion beam IB, and the distance D between the center of rotation RC and the center of swing SC of the sample S are reflected.

With the sample milling apparatus 100, the eccentric distance B is adjusted while watching the positioning camera 130. Therefore, the distance between the center of rotation RC of the sample S and the center BC of the ion beam IB as computed from the tilt angle of the sample S and from the eccentric distance B and as viewed through the positioning camera 130 is displayed on the sample image display section G4.

The generated, forecasted imagery is displayed on the forecasted imagery display section G6. On the imagery display section G6, an image of an unmilled sample and forecasted imagery are displayed superimposed. A slider object 6 is disposed on the forecasted imagery display section G6 to set a transmissivity when the forecasted imagery is superimposed on the image of the unmilled sample. Furthermore, the display section G6 has a check box 8 so that only half of the forecasted imagery is overlappingly displayed on the image of the unmilled sample. The method of displaying forecasted imagery on the forecasted imagery display section G6 will be described in detail later.

1.2.2. Step of Acquiring Information about Ion Beam (S20)

Then, the image generating section 212 acquires information about the ion beam IB. This information is, for example, about a distribution of luminance across the ion beam IB when the ion beam IB having the set energy is made to impinge at the set angle α on the sample S. This information can be derived, for example, from an ion beam image taken by shooting a test sample which emits light by being irradiated with the ion beam. The method of acquisition of the ion beam image is hereinafter described.

First, a glass sample is prepared as a sample that emits light by being irradiated by an ion beam. Then, as shown in FIG. 2, the chamber door 160 is opened, the sample stage assembly 120 is pulled out of the chamber 150, and the glass sample is attached onto the sample stage assembly 120. Then, using the tilt mechanism 20, the tilt angle of the glass sample is adjusted so that the angle of impingement α of the ion beam IB is equal to the set angle of impingement that is one milling condition. Then, the XY stage 28 is manipulated while watching the glass sample through the positioning camera 130 to place the glass sample into the hit position of the ion beam IB. In this way, the glass sample is placed in position.

Then, as shown in FIG. 1, the chamber door 160 is closed and the sample stage assembly 120 is pushed into the chamber 150. The interior of the vacuum chamber 150 is then evacuated to a vacuum. Subsequently, the energy (accelerating voltage) of the ion beam IB is set, and the ion beam IB is made to impinge on the glass sample. At this time, the glass sample is kept still without operating either the rotary mechanism 22 or the swing mechanism 24.

Then, the glass sample under irradiation by the ion beam IB is shot with the milling observation camera 140. As a result, an ion beam image can be obtained. At this time, the electrical current of the ion beam IB is measured.

The captured ion beam image has been taken at an angle corresponding to the tilt angle of the glass sample relative to the surface of the glass sample. To achieve an image taken normal to the surface of the glass sample, the captured ion beam image is stretched by a factor corresponding to the tilt angle. Consequently, the ion beam image has been taken perpendicular to the surface of the glass sample. For example, the ion beam image is a grayscale image consisting of pixels whose luminance levels correspond to the levels of the intensity of impingement of the ion beam IB.

Figure 7:
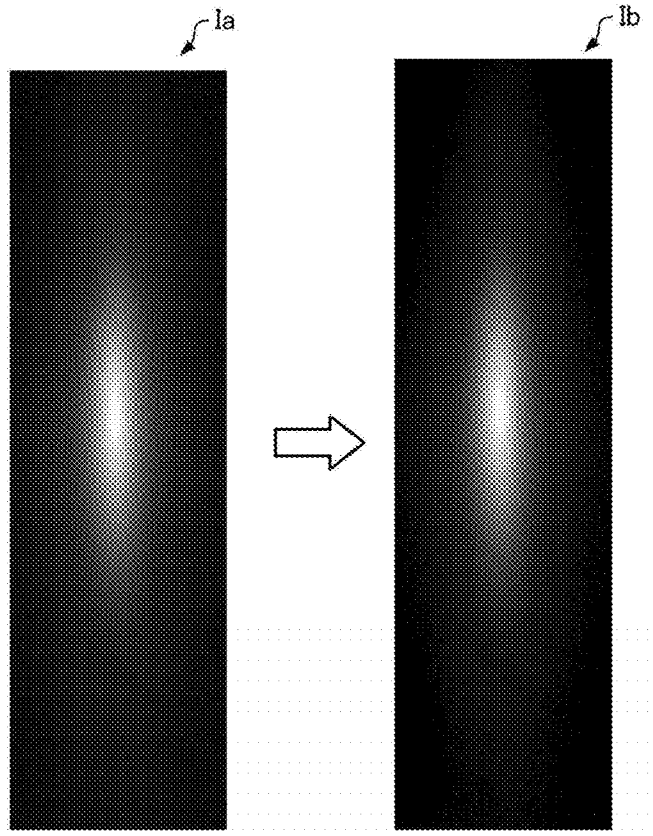
FIG. 7 shows an uncorrected ion beam image and a corrected ion beam image.

FIG. 7 shows an uncorrected ion beam image Ia and a corrected ion beam image Ib. The beam image Ia has been taken while tilting the glass sample through an angle of 80°. Because the relationship, 1/sin (80°)=1.0154, holds, the ion beam image Ia is stretched by a factor of 1.0154 in a vertical direction corresponding to the tilt direction of the glass sample. As a result, the ion beam image Ib can be derived.

1.2.3. Step of Generating forecasted Imagery at each Instant of Time (S30)

(1) First Instant

Figure 8:
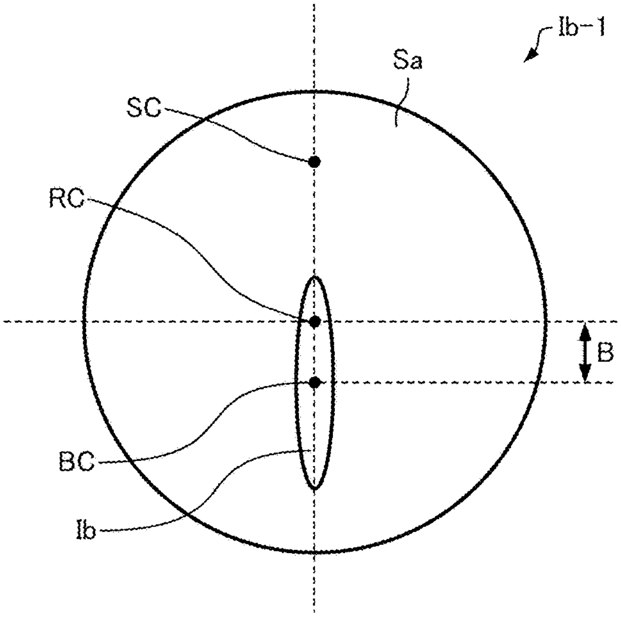
FIGS. 8 and 9 illustrate processing steps for generating forecasted imagery at a first instant of time.
Figure 9:
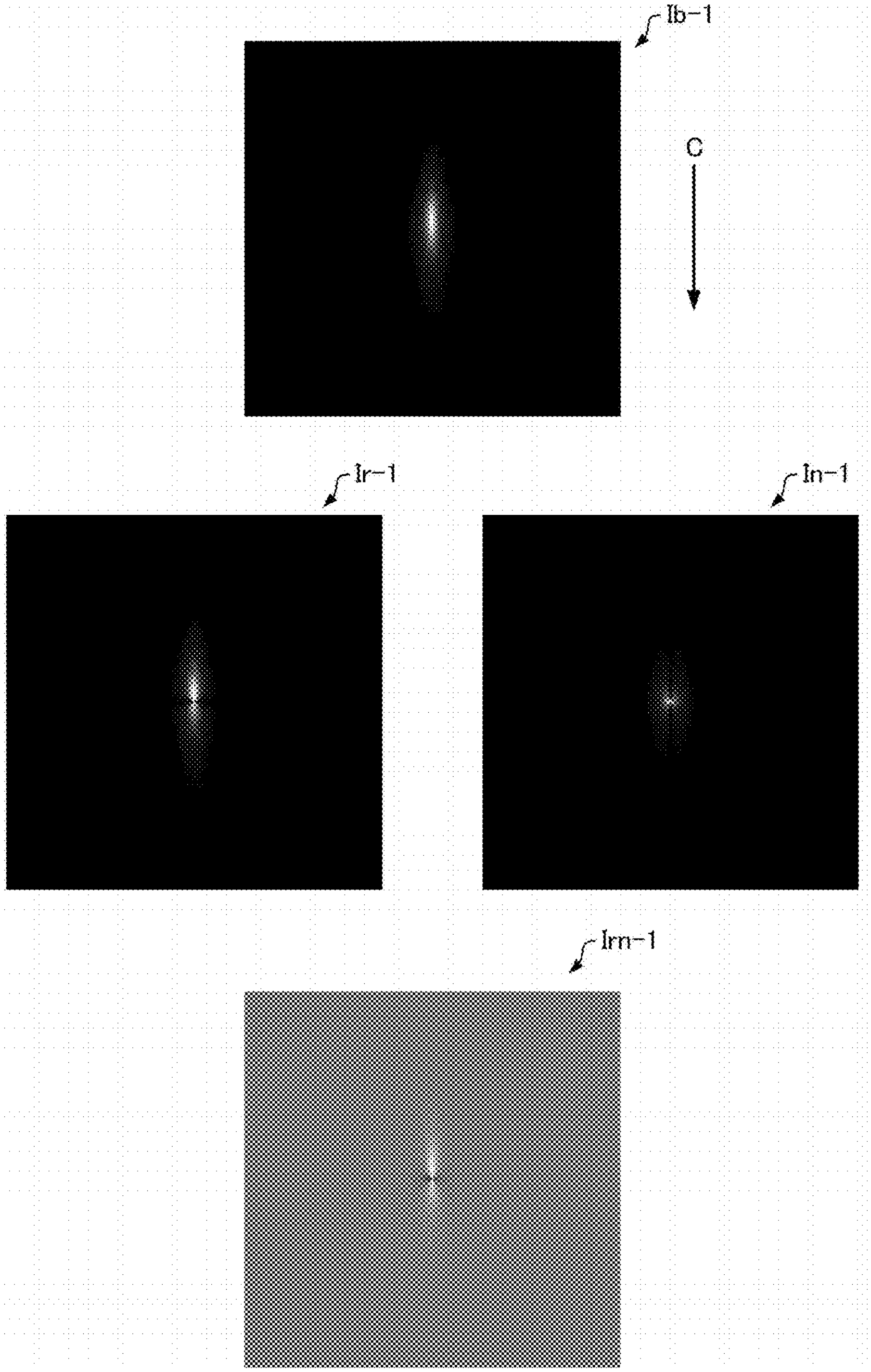

Then, forecasted imagery at a first instant of time at which a milling process is started is generated. FIGS. 8 and 9 illustrate processing steps of generating forecasted imagery at the first instant.

As shown in FIG. 8, the ion beam image Ib is first placed in the space between the set center of rotation RC and the center BC of the ion beam IB and an impingement intensity distribution image Ib-1 at the first instant is generated, the centers RC and BC being spaced apart by a distance of B. The impingement intensity distribution image Ib-1 represents the distribution of the intensity of impingement of the ion beam IB at the first instant. In the impingement intensity distribution image Ib-1 of FIG. 8, the intensity of impingement of the ion beam IB is represented in terms of luminance.

For each pixel of the impingement intensity distribution image Ib-1 at the first instant, the vector is resolved into components. A radial component image Ir-1 representing a distribution of the intensity levels of the radial components of the ion beam IB and a rotational direction component image In-1 representing a distribution of the intensity levels of the components in the rotational direction of the ion beam IB are generated.

Specifically, for each pixel of the impingement intensity distribution image Ib-1, a vector is defined to have a magnitude equal to luminance level Se1 and a sense in the direction of impingement of the ion beam IB. The vector is resolved about the center of rotation RC into a radial direction component Se1 cos $\zeta$ and a rotational direction component Se1 sin $\zeta$. The angle $\zeta$ is formed between the radial direction and the direction of impingement of the ion beam in each pixel. In FIG. 9, the direction of impingement of the ion beam IB is indicated by arrow C. A radial component image Ir-1 in which the magnitude of the radial component is indicated by luminance is generated from the radial component obtained in this way for each pixel. Furthermore, a rotational direction component In-1 in which the magnitude of the rotational direction component is indicated by luminance is generated from the rotational direction component of each pixel.

Then, a vector component distribution image Irn-1 representing a distribution of impingement intensity in the radial direction of the ion beam and impingement intensity in the rotational direction at the first instant of time is created by superimposing the radial component image Ir-1 and the rotational component image In-1. In particular, for each pair of corresponding pixels of the radial component image Ir-1 and the rotational direction component image In-1, luminance values are summed up while taking the radial direction as positive and the rotational direction as negative.

It is assumed that the radial component image Ir-1 has 256 gray levels and that the rotational direction image In-1 also has 256 gray levels. These images are summed up while taking the radial direction as positive and the rotational direction as negative, thus generating an image with 512 gray levels. When this image with 512 gray levels is output with 256 levels, a luminance level corresponding to a zero level is modified to the intermediate, 128th gray level and then the image is normalized using maximum and minimum values of great absolute values.

Consequently, in the vector component distribution image Irn-1, it is shown that locations brighter than the intermediate color have higher ion beam intensity levels in the radial direction and locations darker than the intermediate color have higher ion beam intensity levels in the rotational direction. In this way, the radial direction impingement intensity of the ion beam IB and the rotational direction impingement intensity of the ion beam IB can be visualized. It can be said that, in the vector component distribution image Irn-1, locations brighter than the intermediate color tend to produce milling stripes in the radial direction and locations darker than the intermediate color tend to produce milling stripes in the rotational direction.

In this way, the impingement intensity distribution image Ib-1 and the vector component distribution image Irn-1 can be generated as forecasted imagery at the first instant of time.

(2) Second Instant of Time (2-1) Hit Position of Ion Beam during Swing Motion

Then, at a second instant of time, the hit position of the ion beam IB moved by swinging of the sample S, i.e., the position of the center BC, is found. The second instant is later than the first instant. For example, the second instant is 1 second later than the first instant.

Figure 10:
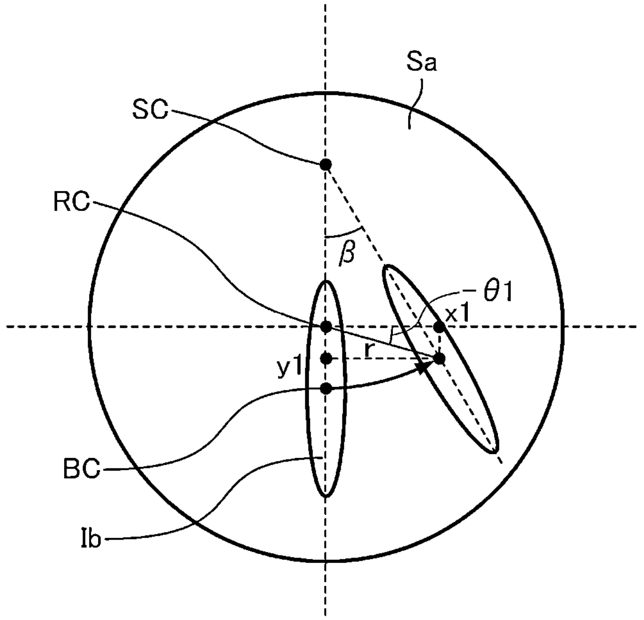
FIGS. 10 and 11 illustrate a method of calculating the hit position of the beam on the sample at a second instant of time.

FIG. 10 illustrates a method of calculating the hit position, at the second instant, of the ion beam IB moved by swinging of the sample. During an interval from the first instant to the second instant, the sample S is swung to rotate the ion beam IB. The angle of rotation $\beta$ of the beam IB is found. The angle of rotation $\beta$ can be found from swing speed, angle of swing, and elapsed time.

The coordinates $(x_1, y_1)$ of the center BC of the ion beam IB at the second instant are then computed using the angle of rotation $\beta$ of the ion beam caused by a swing, the distance D between the center SC of the swing and the center of rotation RC, and the eccentric distance B between the center of rotation RC and the center BC of the beam. The results of the computation are transformed into polar coordinates $(r, \theta_1)$ which can be found from the following calculation formulas:

$$x_1 = (D+B)\sin\beta$$

$$y_1 = D-(D+B)\cos\beta$$

$$r = (x_1^2 + y_1^2)^{1/2}$$

$$\theta_1 = \tan^{-1}(y_1/x_1)$$

(2-2) Hit Position of Ion Beam at Second Instant of Time during Rotation

Figure 11:
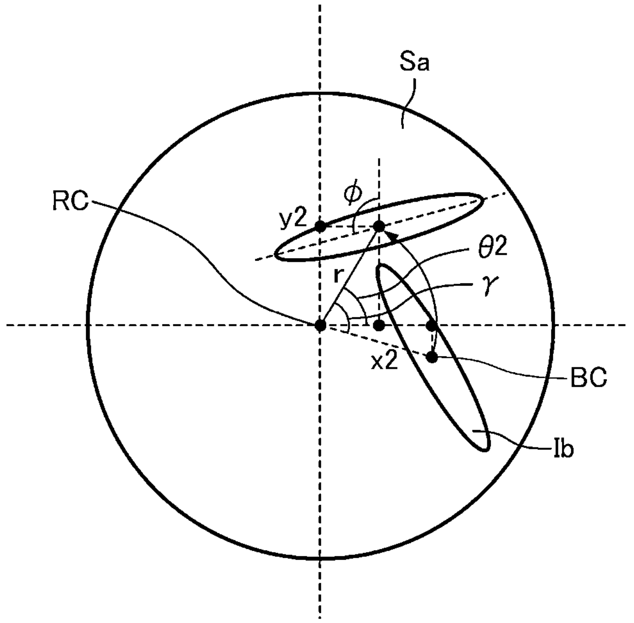

The hit position of the ion beam IB assumed at the second instant of time when moved by a rotation is next found. FIG. 11 illustrates a method of calculating the hit position of the ion beam IB on the sample at the second instant of time, the beam having been moved by a rotation of the sample.

During an interval from the first instant to the second instant, the sample S is rotated, thus rotating the ion beam IB. The angle of rotation γ of the beam IB is found. The angle of rotation γ can be found from the rotational speed and the elapsed time.

Then, the coordinates ($x_2$, $y_2$) of the center BC of the ion beam IB at the second instant of time are found. The angle of rotation γ is added to the angle $\theta_1$. The coordinates of the center BC are set to (r, $\theta_2$). Then, the coordinates (r, $\theta_2$) are transformed into orthogonal coordinates ($x_2$, $y_2$). The angle of rotation ϕ of the ion beam IB at the second instant can be found by adding together the angle of rotation β and the angle of rotation γ. The coordinates ($x_2$, $y_2$) of the center BC can be found using the following calculation formulas:

$$r = (x_2^2 + y_2^2)^{1/2}$$

$$\theta_2 = \theta_1 + \gamma$$

$$\phi = \beta + \gamma$$

(2-3) Resolving of Vector into Its Components

Then, the ion beam image Ib is placed at the coordinates ($x_2$, $y_2$) of the center BC of the ion beam IB, and an impingement intensity distribution image Ib-2 at the second instant of time is generated. Then, for each pixel of the impingement intensity distribution image Ib-2 at the second instant, the vector is resolved into its components. Thus, a radial component image Ir-2 and a rotational component image In-2 at the second instant of time are generated.

Figure 12:
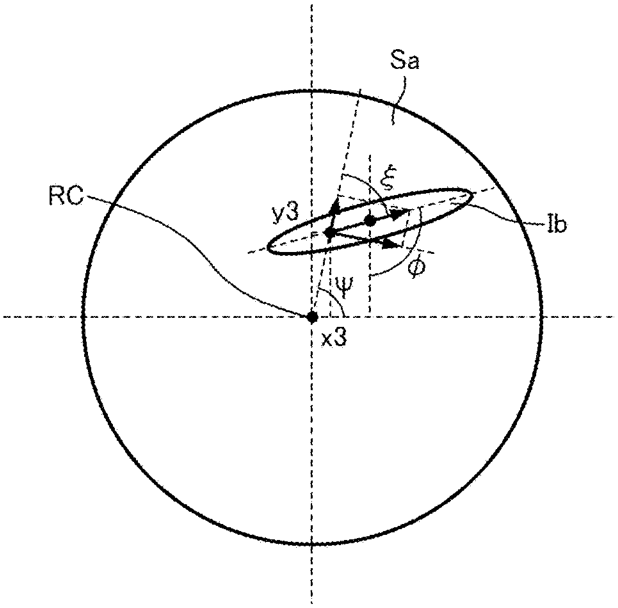
FIG. 12 is a diagram illustrating the manner in which a vector is resolved into its components.

FIG. 12 illustrates resolving of a vector into its components. At the pixel of the coordinates ($x_3$, $y_3$), a vector is defined to have a magnitude equal to the magnitude of the luminance Se1 and a sense equal to the direction of impingement of the ion beam IB. The vector is resolved about the center of rotation Rc into a radial direction component Sr and a rotational direction component Sn. At the second instant of time, the radial direction component Sr and the rotational direction component Sn at the pixel having the coordinates ($x_3$, $y_3$) can be found from the following calculation formulas:

$$\Psi = \tan^{-1}(y_3/x_3)$$

$$\xi = \Psi + (\pi/2-\phi)$$

$$Sr = |Sel\ \cos\xi|$$

$$Sn = |Sel\ \sin\xi|$$

With respect to each of the other pixels of the impingement intensity distribution image Ib-2, the radial direction component Sr and the rotational direction component Sn can be found using the above formulas. Consequently, the radial component image Ir-2 and the rotational direction component image In-2 can be generated.

Then, by superimposing the radial component image Ir-2 and the rotational component image In-2, a vector component distribution image Irn-2 representing a distribution of the impingement intensity in the radial direction of the ion beam and the impingement intensity in the rotational direction at the second instant of time is generated. In this way, the impingement intensity distribution image Ib-2 and the vector component distribution image Irn-2 can be generated as forecasted imagery at the second instant of time.

Also, with respect to each instant of time later than the second instant and up to the end of the milling process time, an impingement intensity distribution image and a vector component distribution image are generated in the same manner as for the second instant.

1.2.4. Step of Adding Up Forecasted Imagery Generated at Successive Instants of Time (S40)

Figure 13:
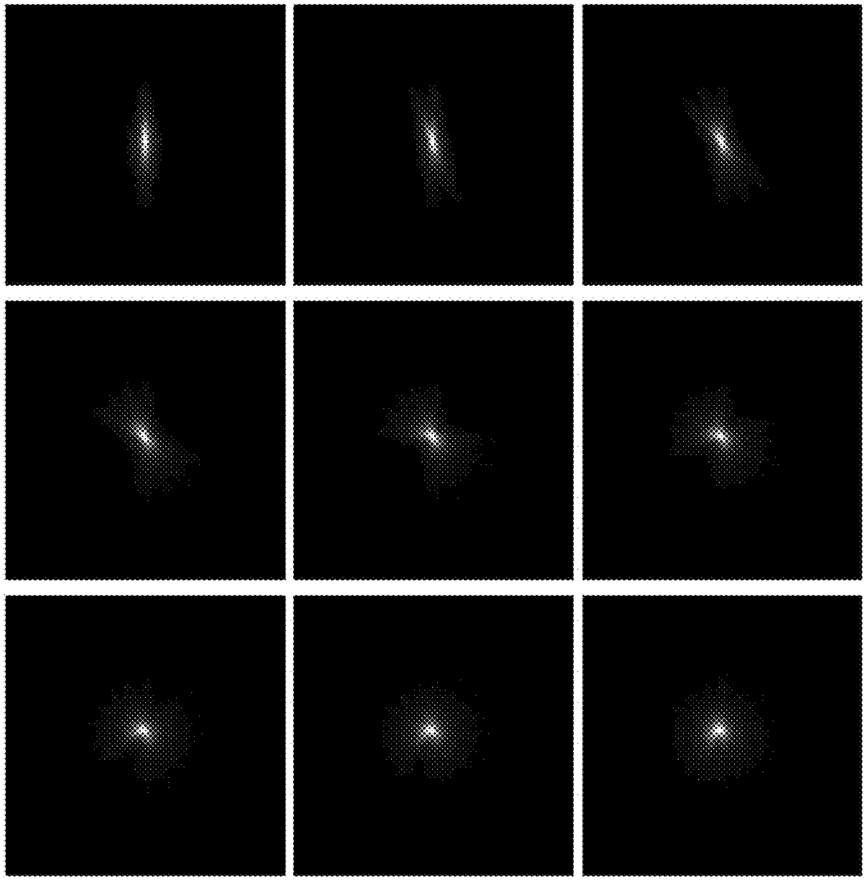
FIG. 13 illustrates the manner in which a new impingement intensity distribution image is superimposed every second.

The impingement intensity distribution images generated at successive instants of time from the first instant up to the nth instant following the milling process time are added up to generate an impingement intensity distribution image representing a distribution of the impingement intensity of the ion beam IB after a passage of the set milling process time. In particular, the luminance values of the corresponding pixels of the impingement intensity distribution images generated at the first to nth instants, respectively, are summed up to generate an impingement intensity distribution image after a passage of the set milling process time. FIG. 13 illustrates the manner in which impingement intensity distribution images occurring successively at the first to ninth instants of time are successively superimposed. The successive instants are at intervals of 1 second. More specifically, at the first instant, a first impingement intensity distribution image is generated as shown at the leftmost top of FIG. 13. At the second instant, a second impingement intensity image is generated and superimposed on the first impingement intensity distribution image generated at the first instant. The resulting composite image is shown at the horizontally immediately adjacent location (i.e., the central top view) of FIG. 13. In this way, nine impingement intensity images are superimposed. The final composite image is shown at the rightmost bottom of FIG. 13.

Similarly, vector component distribution images generated at successive instants from the first to nth instants are summed up to generate a vector component distribution image which represents a distribution of the impingement intensity of the ion beam IB in the radial direction assumed after a passage of the set milling process time and a distribution of the impingement intensity in the rotational direction. As a result of the processing steps described so far, an impingement intensity distribution image and a vector component distribution image can be generated as forecasted imagery for a case where the sample S is milled under the set milling process conditions.

1.3. Forecasted Imagery 1.3.1. Impingement Intensity Distribution Images

Figure 14:
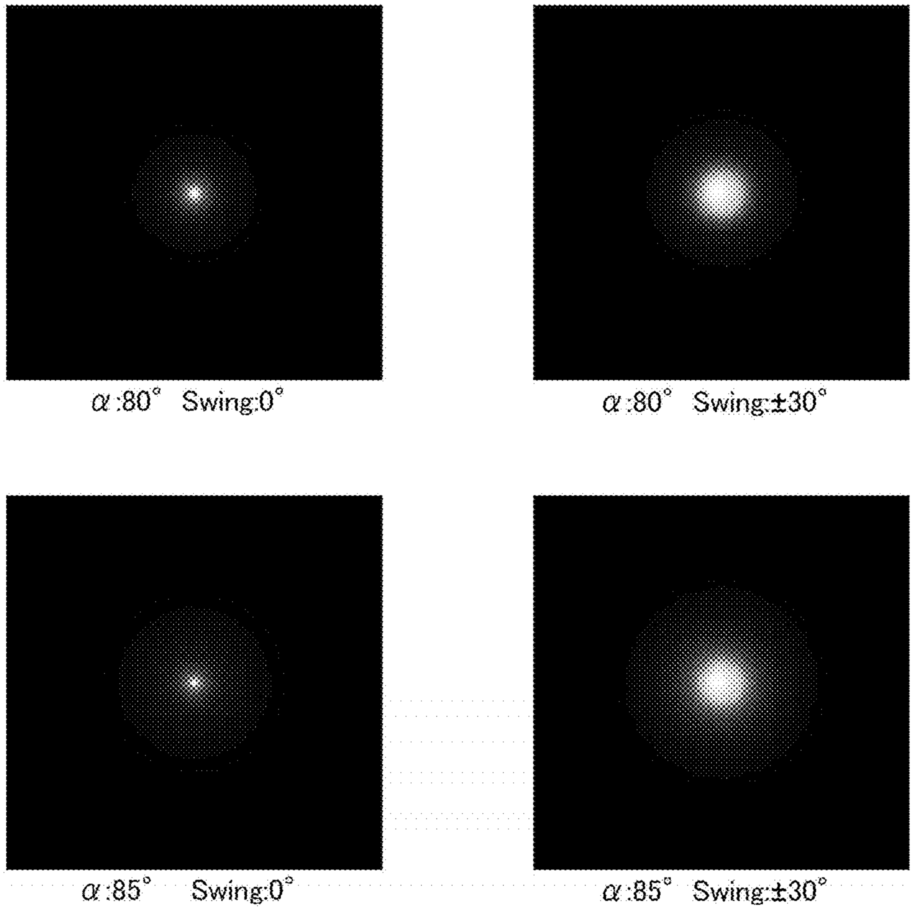
FIG. 14 shows impingement intensity distribution images of an ion beam.

FIG. 14 shows impingement intensity distribution images representing distributions of the impingement intensity of the ion beam IB on the sample S when it is milled under the preset milling process conditions. Four impingement intensity distribution images have been obtained under different sets of milling process conditions.

More specifically, a first impingement intensity distribution image of FIG. 14 has been constructed by setting the angle of impingement α of the ion beam IB to 80° and the swing angle to 0° (i.e., no swing). A second distribution image has been constructed by setting the angle of impingement α of the ion beam IB to 80° and the swing angle to between −30° and +30°. A third distribution image has been constructed by setting the angle of impingement α of the ion beam IB to 85° and the swing angle to 0°. A fourth distribution image has been constructed by setting the angle of impingement α of the ion beam IB to 85° and the swing angle to between-30° and +30°. These four impingement intensity distribution images are identical in other milling process conditions. In the distribution images of FIG. 14, the luminance has been normalized with a maximum luminance.

Figure 15:
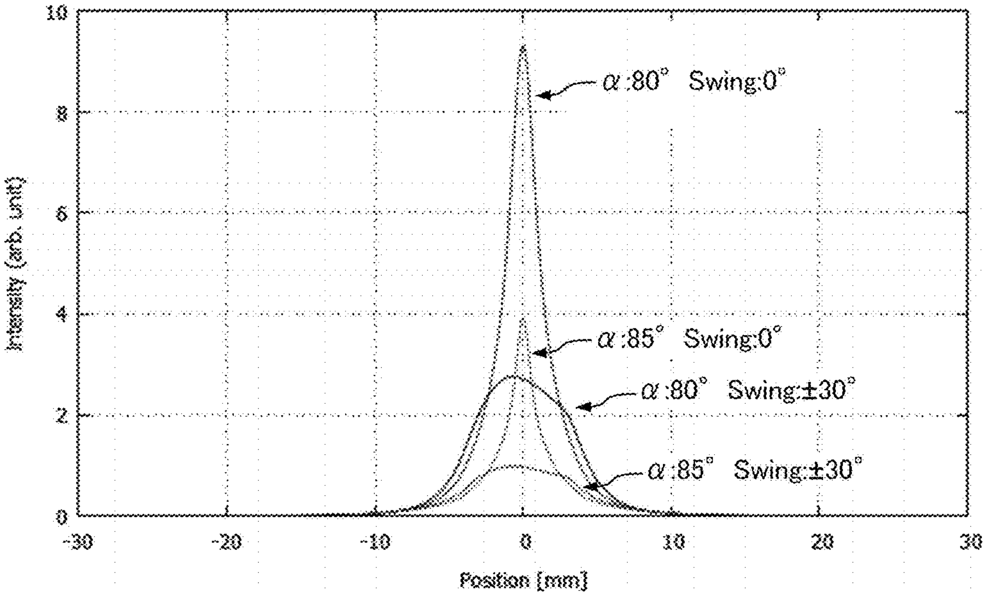
FIG. 15 is a luminance profile graph of the impingement intensity distribution images.

FIG. 15 is a graph showing the luminance profiles of the impingement intensity distribution images. The four luminance profiles of FIG. 15 have been taken on the centerlines of the distribution images of FIG. 14. In each luminance profile of FIG. 15, the electrical current value of the ion beam is normalized with the total luminance of the impingement intensity distribution image, converted into a current density, and multiplied by a factor equal to the component of the ion beam in the depth direction, the beam being incident at an angle of α. That is, the vertical axis of the graph of FIG. 15 represents milling depth.

It is seen from the four impingement intensity distribution images of FIG. 14 and the four luminance profiles of FIG. 15 that a smoother and wider area can be formed around the center of the sample S by swinging the sample S as compared with the case where no swing is made.

1.3.2. Vector Component Distribution Images

Figure 16:
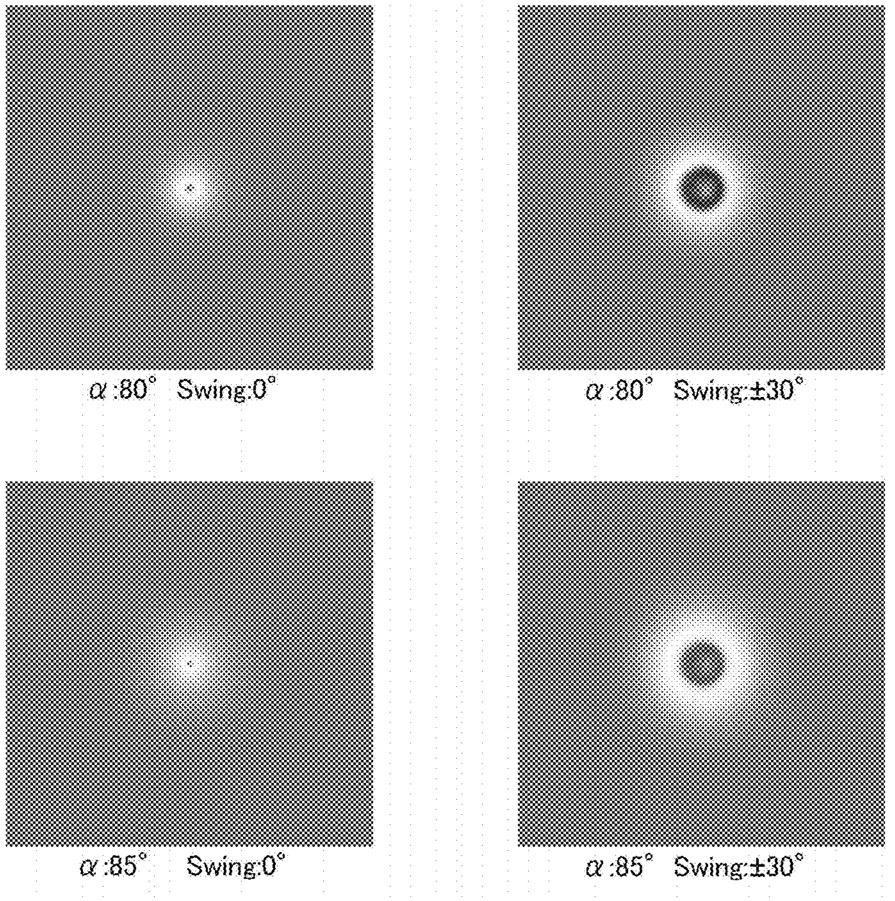
FIG. 16 shows vector component distribution images.

FIG. 16 shows vector component distribution images representing distributions of the impingement intensity of the ion beam IB as taken in the radial direction and the impingement intensity of the beam as taken in the rotational direction on the sample S when it is milled under preset milling process conditions. In FIG. 16, there are shown four distribution images created under different sets of milling process conditions.

In each vector component distribution image of FIG. 16, the luminance has been normalized with its maximum luminance level. In each distribution image of FIG. 16, locations brighter than the intermediate color are higher in ion beam impingement intensity as taken in the radial direction and locations darker than the intermediate color are higher in ion beam impingement intensity as taken in the rotational direction. That is, in the locations brighter than the intermediate color, milling stripes in the radial direction tend to occur, while in the locations darker than the intermediate color, milling stripes in the rotational direction tend to occur.

Figure 17:
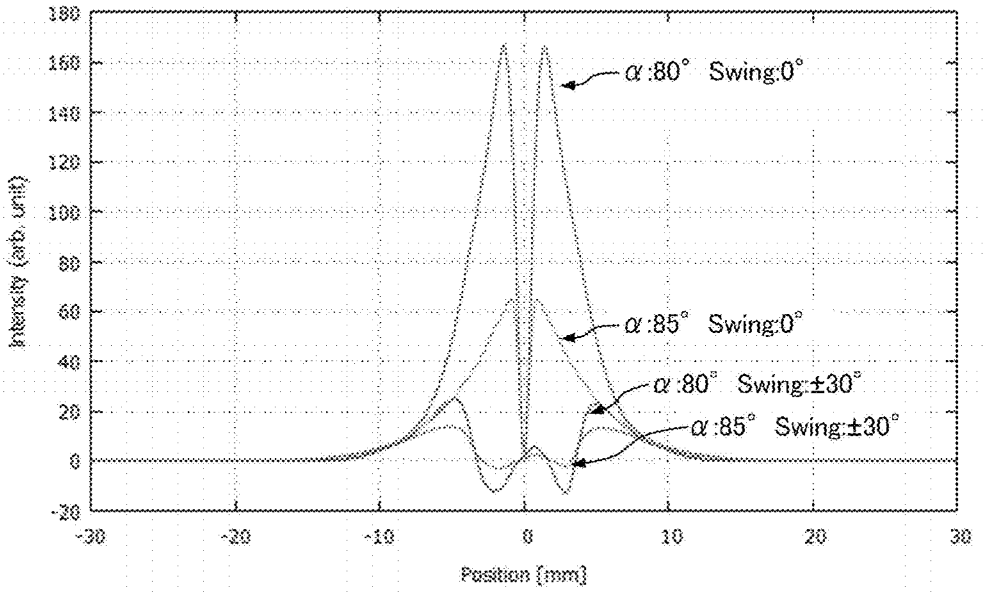
FIG. 17 is a graph of the luminance profiles of the vector component distribution images.

FIG. 17 is a graph showing luminance profiles of the vector component distribution images of FIG. 16, as taken on their centerlines. In each luminance profile of FIG. 17, if the intensity on the vertical axis is positive, the ion beam impingement intensity as taken in the radial direction is higher, and conversely if the intensity on the vertical axis is negative, the ion beam impingement intensity as taken in the rotational direction is higher. That is, if the intensity is positive, milling stripes in the radial direction tend to occur. If the intensity is negative, milling stripes in the rotational direction tend to occur.

It is seen from the four vector component distribution images of FIG. 16 and the four luminance profiles of FIG. 17 that, when the sample S is not swung, there is a narrow irradiated area in the vicinity of the center of the sample S as viewed both in the rotational direction and in the radial direction and that the ion beam intensity in the radial direction is high outside the vicinity of the center. That is, when the sample S is not swung, there is a narrow area where milling stripes are unlikely to occur near the center of the sample S and milling stripes in the radial direction tend to occur outside the vicinity of the center.

On the other hand, when the sample S is swung, there occurs a region which is irradiated with the ion beam in the vicinity of the center of the sample S and which is wider in area as viewed in the rotational direction and also in the radial direction than when the sample is not swung. Furthermore, outside the vicinity of the center, the ion beam intensity is lower both in the radial direction and in the rotational direction. That is, it is seen that, when the sample S is swung, a smooth and wider area which is less affected by milling stripes can be formed near the center of the sample S than when the sample S is not swung.

1.3.3. Display Method

In each vector component distribution image of FIG. 16, a distribution as taken in the direction of impingement of the ion beam IB is represented by making the impingement intensity of the ion beam as taken in the radial direction higher than the intermediate color and making the impingement intensity of the ion beam as taken in the rotational direction lower than the intermediate color. The method of representing a distribution as taken in the direction of impingement of the ion beam IB is not restricted to this.

For example, a distribution taken in the direction of impingement of the ion beam IB may be represented in terms of colors. In particular, the impingement intensity in the radial direction is represented in cyan (green+blue), and the impingement intensity in the radial direction may be represented in red. In this display method, if the impingement intensity in the radial direction and the impingement intensity in the rotational direction are identical, then there is no chroma and thus a gray scale occurs. Therefore, even in a vector component distribution image, the same information as in an impingement intensity distribution image can be represented. That is, in this display method, a distribution of the intensity of the ion beam IB and a distribution of directions of impingement can be represented in one image. The combination of colors is not restricted to cyan and red. A combination of magenta (red+blue) and green may also be possible. Furthermore, a combination of yellow (red+green) and blue may be possible.

1.3.4. Correction of Forecasted Imagery

In the luminance profiles of the above-cited FIG. 15, the luminance of an impingement intensity distribution image is corrected with coefficients corresponding to an electrical current density and an impingement angle. Alternatively, luminance profiles may be created by correcting the luminance levels of impingement intensity distribution images with milling depths into which samples have been actually milled under the same milling process conditions. In this case, the vertical axis of each luminance profile can be represented by milling depth.

Since the ion milling rate differs according to the energy of the ion beam or the material constituting the sample, the luminance of each impingement intensity distribution image may be corrected according to either the milling process conditions set by the user or the used sample.

1.4. Display

Referring back to FIG. 4, with the image generator apparatus 200, the display control section 214 displays forecasted imagery on the display section 230. The display control section 214 displays forecasted imagery, for example, on the forecasted imagery display section G6 of the GUI screen 4 of FIG. 6.

Figure 18:
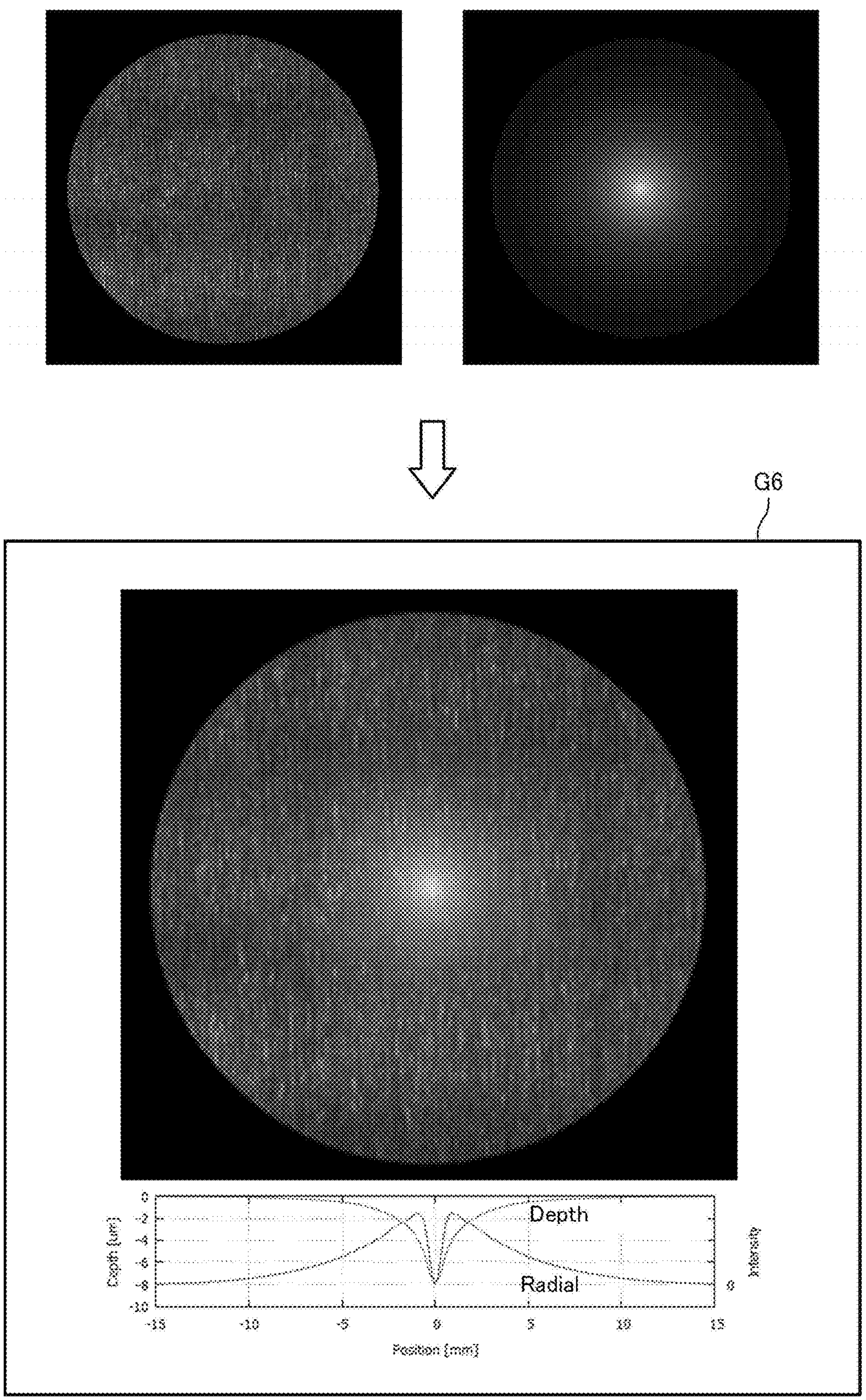
FIGS. 18-22 illustrate examples of method of displaying forecasted imagery.

FIG. 18 illustrates one example of method of displaying forecasted imagery. An image of an unmilled sample S and a vector component distribution image are displayed superimposed. Furthermore, positions on the horizontal axis of the luminance profile are shown aligned with the positions on the image of the sample S. For example, the image of the unmilled sample S is taken by the positioning camera 130 or the milling observation camera 140.

In the example of FIG. 18, the vertical axis representing luminance profile is converted into milling depth. In the luminance profile of FIG. 18, a milling depth profile and a radial direction component profile are shown.

Figure 19:
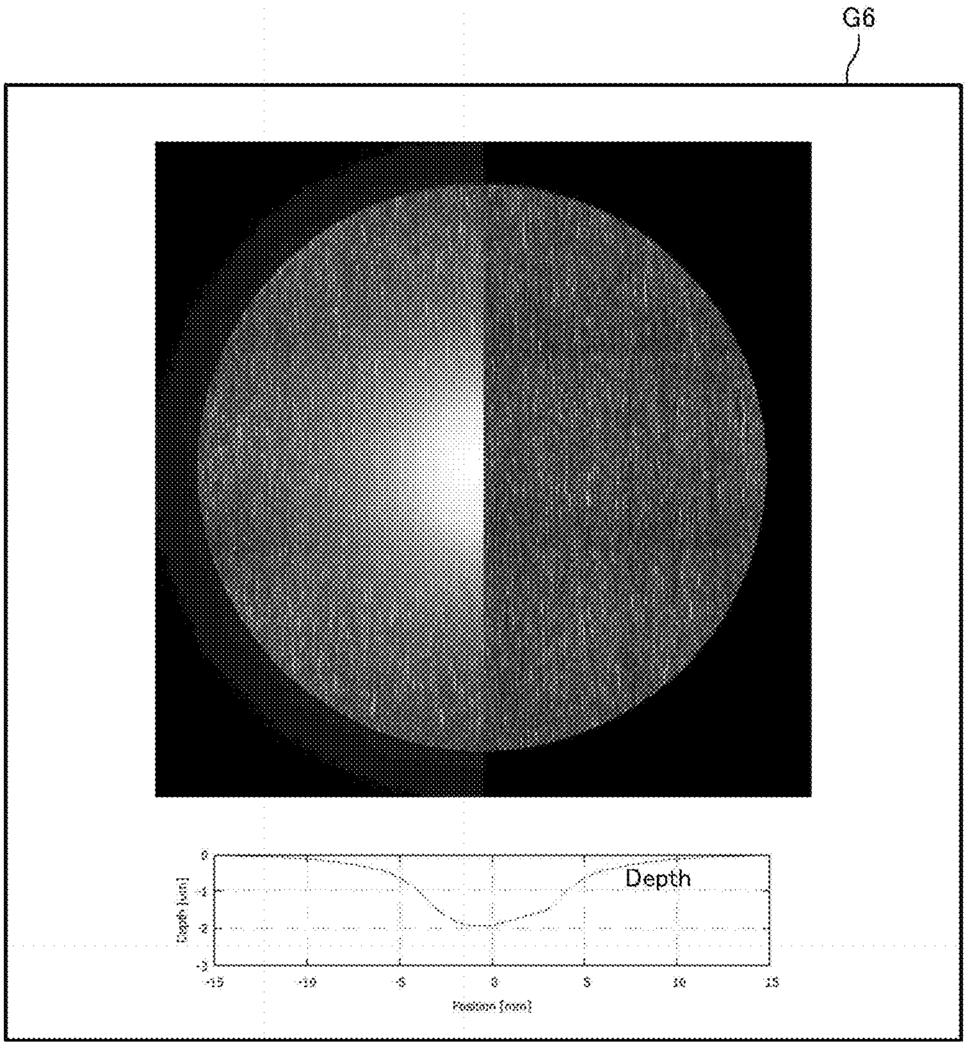

FIG. 19 illustrates one example of method of displaying forecasted imagery. In this example, an image of an unmilled sample S and a left half of a vector component distribution image are displayed superimposed.

Figure 20:
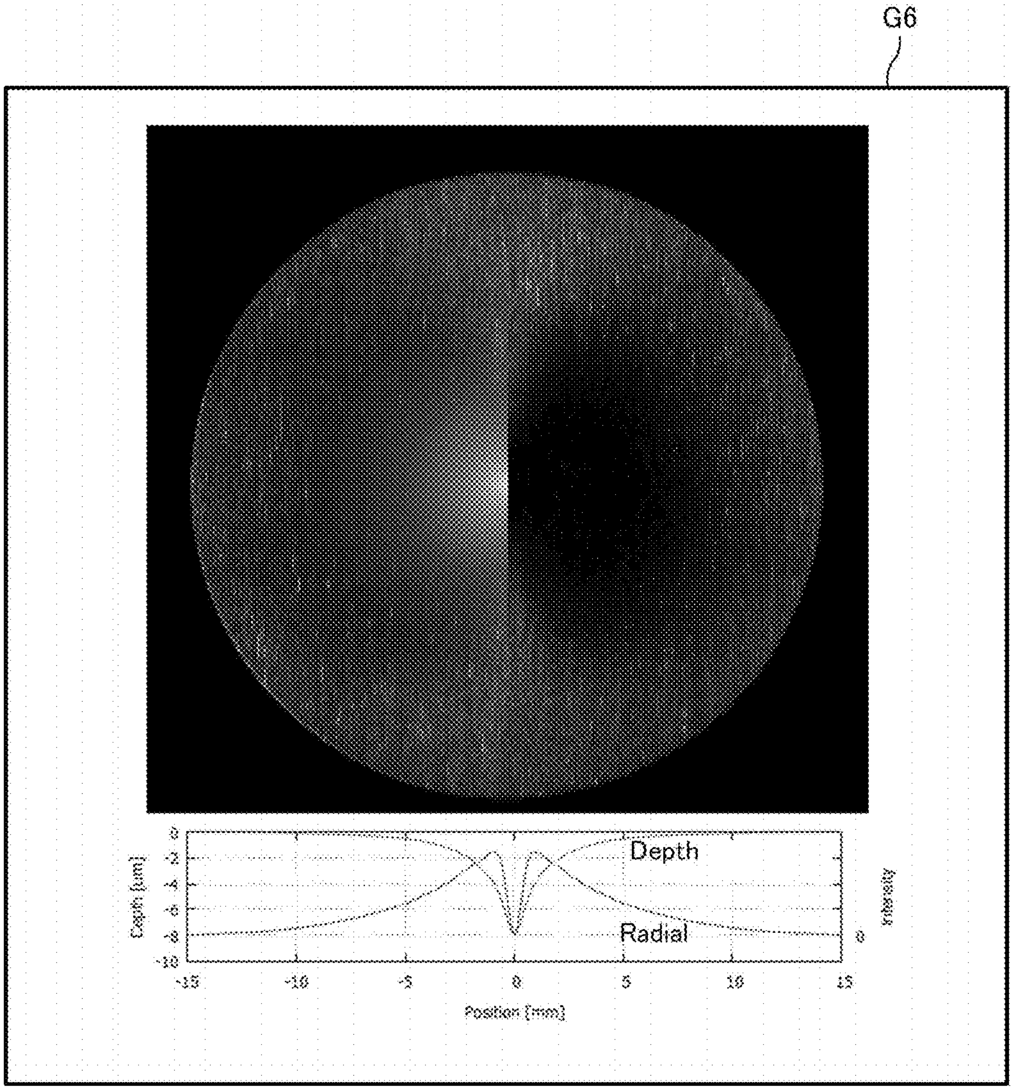

FIG. 20 illustrates another example of method of displaying forecasted imagery. In this example of FIG. 20, an image of the already milled sample S and a left half of an image of a vector component distribution image are shown superimposed. Furthermore, the positions indicated by the horizontal axis of the luminance profile are shown aligned with the positions on the image of the sample S.

Figure 21:
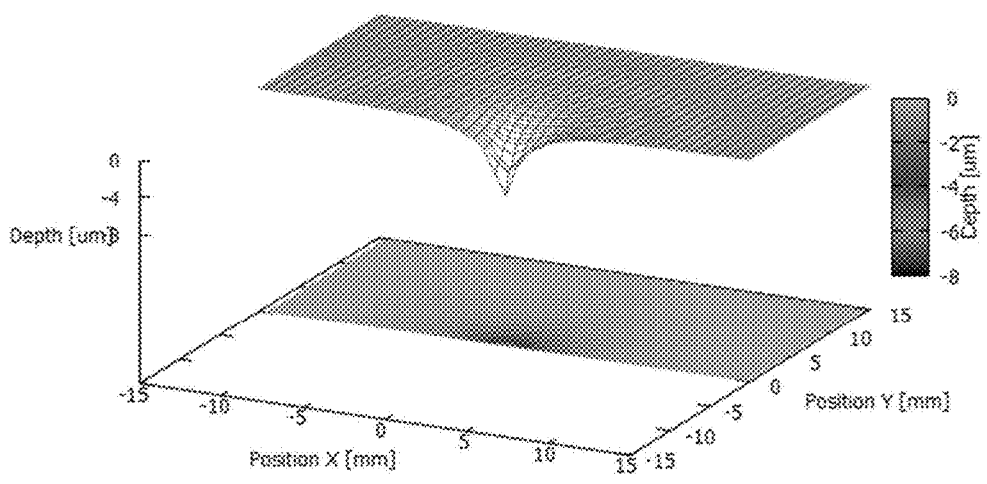

FIG. 21 illustrates a further example of method of displaying forecasted imagery. In this example of FIG. 21, the luminance of an impingement intensity distribution image is corrected to milling depth and shown as a three-dimensional graph indicating positions on the sample S and milling depths at those positions.

Figure 22:
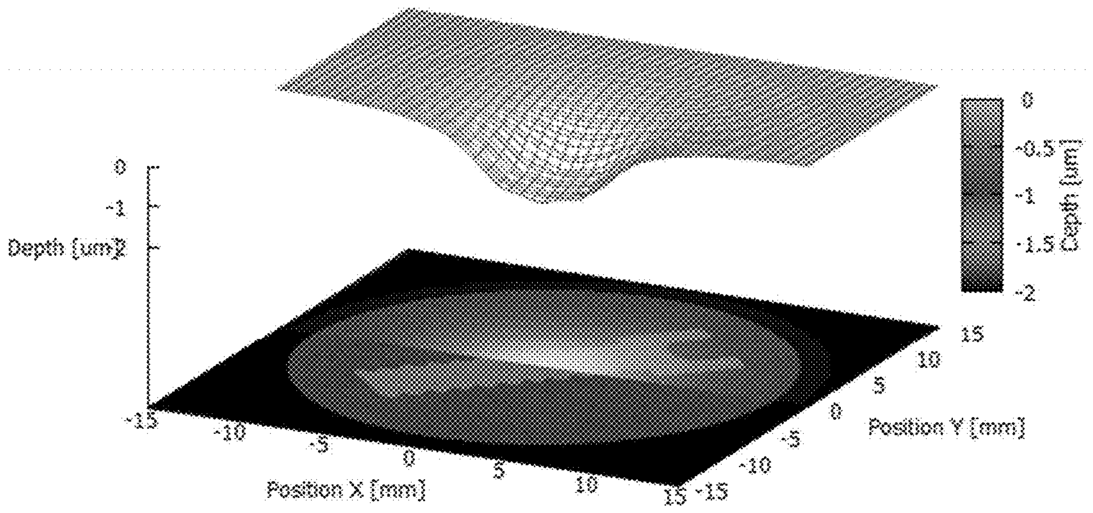

FIG. 22 illustrates a further example of method of displaying forecasted imagery. In this example of FIG. 22, both a composite image and a three-dimensional graph indicating positions on the samples and milling depths at those positions are shown. In the composite image, an image of an unmilled sample S and a vector component distribution image are shown superimposed.

1.5. Processing for Image Generation

Figure 23:
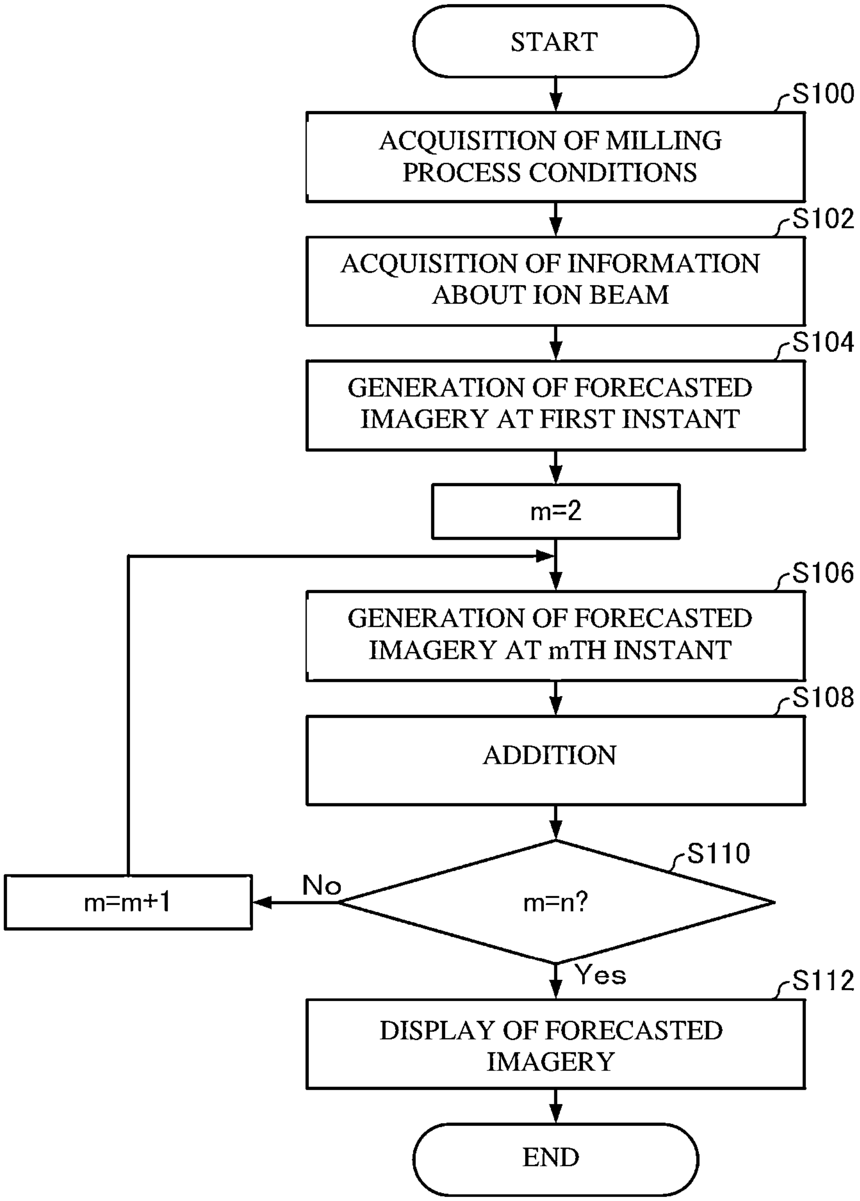
FIG. 23 is a flowchart illustrating one example of processing sequence performed by an image generator apparatus for image generation.

FIG. 23 is a flowchart illustrating one example of processing sequence for image generation performed by the image generator apparatus 200. First, the image generating section 212 acquires information about preset milling process conditions (S100) which are set, for example, by entering the milling process conditions into the GUI screen 4. The image generating section 212 may acquire information about milling process conditions entered into the GUI screen 4 by the user via the input section 220. The image generating section 212 may also obtain information about milling process conditions from the controller 170.

The milling process conditions include the energy of the ion beam IB (accelerating voltage of the ion beam), the angle of impingement $\alpha$ of the ion beam IB, the rotational speed of the sample S, the angular range of swing of the sample S, the swing speed of the sample S, the eccentric distance B between the center of rotation RC of the sample S and the center BC of the ion beam IB, the distance D between the center of rotation RC and the center of swing SC of the sample S, and the milling time. Information about these milling process conditions are stored in the storage section 240.

Then, the image generating section 212 acquires information about the ion beam IB (S102). For this purpose, the image generating section 212 acquires the ion beam image Ib as shown in FIG. 6. The image Ib is stored, for example, in the storage section 240.

The image generating section 212 then generates forecasted imagery at the first instant of time based on the milling process conditions and the information about the ion beam IB (S104) by the technique described in the above-described step S30. The forecasted imagery at the first instant consists of an impingement intensity distribution image Ib-1 and a vector component distribution image Irn-1.

Then, the image generating section 212 generates forecasted imagery for the mth instant of time based on the milling process conditions (S106). In this specific example, assuming that m=2, the image generating section 212 generates forecasted imagery at the second instant of time. An impingement intensity distribution image Ib-2 and a vector component distribution image Irn-2 are generated as forecasted imagery forecasted to occur at the second instant by the image generating section 212 using the technique described in the above-described step S30.

Then, the image generating section 212 adds up the forecasted imagery produced at the first instant and the forecasted imagery produced at the second instant (S108). In particular, the generating section adds up the impingement intensity distribution images Ib-1 and Ib-2. Also, the generating section adds up the vector component distribution images Irn-1 and Irn-2. Consequently, forecasted imagery can be created for the case where milling is done from the first to the second instant.

The image generating section 212 then makes a decision as to whether forecasted imagery for the nth instant of time has been generated (S110). If the decision at S110 is negative (No), i.e., forecasted imagery for the nth instant has not been generated, the image generating section 212 determines that m=2+1=3 and returns to the step S106, where forecasted imagery is generated for a third instant of time (S106). The image generating section 212 adds the forecasted imagery for the third instant to the forecasted imagery derived when milling is done from the first instant to the second instant (S108). As a result, forecasted imagery can be created for a case where milling is done from the first instant to the third instant.

The image generating section 212 repeatedly performs the step S106 of generating forecasted imagery at the mth instant of time, the step S108 of adding up the forecasted imagery at the mth instant and the forecasted imagery for the case where milling is done from the first instant to the (m−1)th instant, and the step S110 of making a decision as to whether forecasted imagery for the nth instant has been generated.

If the image generating section 212 determines that forecasted imagery for the nth instant has been generated, i.e., the decision at the step S110 is affirmative (Yes), the display control section 214 displays the generated forecasted imagery on the display section 230. The display control section 214 displays the forecasted imagery on the forecasted imagery display section G6 of the GUI screen 4 by any one of the display methods illustrated in FIGS. 14-22. The display control section 214 may display the forecasted imagery on the display section 230 by that of the display methods illustrated in FIGS. 14-22 which is selected by the user. Because of the processing steps described thus far, forecasted imagery for the case where the sample is milled under preset milling process conditions can be displayed.

1.6. Advantageous Effects

The sample milling system 2 includes the sample milling apparatus 100 for milling the sample S by making the ion beam IB impinge on the sample S and the image generator apparatus 200 for generating forecasted imagery for a case where the sample S is milled under preset milling process conditions by the use of the sample milling apparatus 100. This permits the sample milling system 2 to determine suitable milling process conditions with ease.

Furthermore, in the sample milling system 2, the generated forecasted imagery contains information about a distribution of the ion beam IB as taken in the direction of impingement. Therefore, the sample milling system 2 can forecast on what area of the sample S and in what directions milling stripes are formed. For example, with respect to an area of the sample S on which the ion beam IB impinges only from one direction, milling stripes may form along the direction of impingement of the ion beam IB.

In the sample milling system 2, the sample milling apparatus 100 includes the ion source 110 for emitting the ion beam IB at the sample S and the sample stage assembly 120 that is equipped both with the tilt mechanism 20 for tilting the sample S and with the rotary mechanism 22 for rotating the sample S. The milling process conditions include the tilt angle and the rotational speed of the sample S. Since the sample milling system 2 can generate forecasted imagery taking account of the tilt angle and rotational speed, the system can easily determine suitable conditions for the tilt angle and rotational speed of the sample S.

In the sample milling system 2, the sample stage assembly 120 has the swing mechanism 24 for swinging the sample S. The center of swing SC of the sample S and the center of rotation RC of the sample S are at different positions. The milling process conditions include the distance D between the center of rotation RC and the center of swing SC. Therefore, the sample milling system 2 can swing the sample S while rotating it. This can enlarge the area on the surface Sa of the sample S which is irradiated with the ion beam IB. Furthermore, the area on the surface Sa of the sample S which is irradiated with the ion beam IB from multiple directions can be enlarged. In addition, the sample milling system 2 can generate forecasted imagery taking account of the center-to-center distance D and so suitable conditions for the distance D can be determined easily.

Additionally, in the sample milling system 2, the distance D between the center of rotation RC of the sample S and the center of swing SC of the sample S is variable. Because the sample milling system 2 can generate forecasted imagery while taking account of the center-to-center distance D, suitable conditions for the distance D can be determined easily.

In the sample milling system 2, the eccentric distance B between the center BC of the ion beam IB on the sample S and the center of rotation RC of the sample S is variable, and the milling process conditions include the eccentric distance B between the beam center BC and the center of rotation RC. Therefore, in the sample milling system 2, the area on the surface Sa of the sample S which is irradiated with the ion beam IB can be widened. Furthermore, in the sample milling system 2, forecasted imagery taking account of the eccentric distance B can be created and so suitable conditions for the eccentric distance B can be determined easily.

In the sample milling system 2, the image generator apparatus 200 calculates a direction of impingement of the ion beam IB taken at each instant during the milling process based on the milling process conditions and generates forecasted imagery based on the calculated direction of impingement of the ion beam IB taken at each instant. Therefore, the sample milling system 2 can create forecasted imagery containing information about a distribution of directions of impingement of the ion beam IB.

In the sample milling system 2, the image generator apparatus 200 resolves, at each instant of time, a vector representing the direction and intensity of impingement of the ion beam IB into a radial direction component and a rotational direction component about the center of rotation RC of the sample S. Furthermore, the image generator apparatus 200 creates forecasted imagery containing information about a distribution of intensity of the ion beam IB as taken in a radial direction and information about a distribution of the intensity of the ion beam IB as taken in the radial direction, based on the radial direction component and the rotational direction component derived at each instant of time. Consequently, with the sample milling system 2, it is possible to know from the forecasted imagery what regions on the surface Sa of the sample S tend to produce milling stripes in the radial direction and milling stripes in the rotational direction.

In the sample milling system 2, the image generator apparatus 200 causes forecasted imagery and an image of the unmilled sample S to be shown superimposed. Therefore, in the sample milling system 2, it is possible to display what regions of the sample S have been milled and how they have been milled in an easily understandable manner.

In the sample milling system 2, the image generator apparatus 200 provides a color representation of directions of impingement of the ion beam in forecasted imagery. Consequently, in the image generator apparatus 200, a distribution of directions of impingement of the ion beam within the forecasted imagery can be displayed in an easily understandable manner.

In the sample milling system 2, forecasted imagery contains information about a distribution of the impingement intensity of the ion beam. Therefore, with the sample milling system 2, when the sample S is milled under preset milling process conditions, it is possible to know what region of the sample S is milled to what depth.

In the sample milling system 2, forecasted imagery contains information about a distribution of the impingement intensity of the ion beam IB as taken in a radial direction about the center of rotation RC of the sample S and information about a distribution of the impingement intensity of the ion beam IB in a rotational direction about the center of rotation RC of the sample S. Therefore, with the sample milling system 2, when the sample S is milled under preset milling process conditions, it is possible to know in what region on the surface Sa of the sample S milling stripes in the radial direction tend to be produced and in what region milling stripes in the rotational direction tend to be produced.

The image generator apparatus 200 includes: the image generating section 212 for generating forecasted imagery for a case where the sample S is milled under preset milling process conditions by the use of the sample milling apparatus 100 for milling the sample S by making an ion beam impinge on the sample; and the display control section 214 for displaying the forecasted imagery. The forecasted imagery contains information about a distribution of the ion beam as taken in the direction of impingement of the beam. Consequently, the image generator apparatus 200 can generate the forecasted imagery for a case where the sample S is milled under the preset milling process conditions and so suitable milling process conditions can be determined easily.

An image generation method for use with the sample milling system 2 involves the steps of: generating forecasted imagery for a case where the sample S is milled under preset milling process conditions by the use of the sample milling apparatus 100 for milling the sample S by making the ion beam IB impinge on the sample S; and displaying the forecasted imagery that contains information about a distribution of directions of impingement of the ion beam IB. Therefore, in the image generation method implemented by the sample milling system 2, there is obtained forecasted imagery for a case where the sample S is milled under the preset milling process conditions. Consequently, suitable milling process conditions can be determined easily.

2. Second Embodiment

Figure 24:
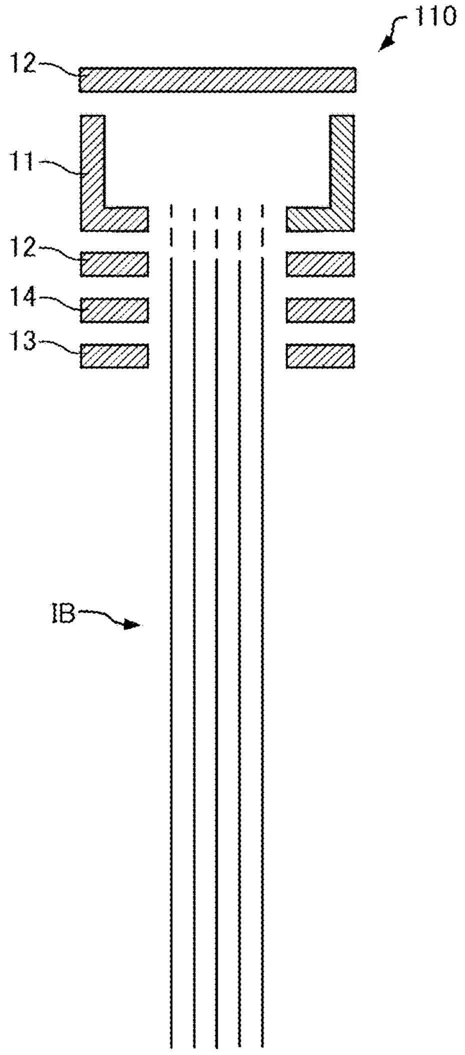
FIG. 24 is a diagram of an ion source for use in a sample milling system associated with a second embodiment.

A sample milling system associated with a second embodiment is next described by referring to FIG. 24, which shows the configuration of an ion source 110 incorporated in the sample milling system associated with the second embodiment. Those members of the sample milling system associated with the second embodiment which are similar in function to their counterparts of the sample milling system 2 associated with the first embodiment are indicated by the same reference numerals as in the above-referenced figures and a detailed description thereof will be omitted below.

The ion source 110 is a Penning-type ion source and includes an anode 11, a cathode 12, an extraction electrode 13, and a focusing electrode 14 as shown. The anode 11 is cylindrical in shape and has an interior space serving as an ionization chamber for producing ions. A gas such as argon gas is admitted into the ionization chamber from a gas source in an unillustrated manner.

The cathode 12 emits electrons and constitutes polepieces that produce a magnetic field in the ionization chamber. The electrons emitted from the cathode 12 are revolved by the magnetic field produced by the polepieces. A discharge voltage is applied between the anode 11 and the cathode 12 to induce an electric discharge.

The extraction electrode 13 extracts ions produced in the ionization chamber. The electric field produced by the extraction electrode 13 accelerates the ions which are then released as the ion beam IB from the ion source 110. An acceleration voltage is applied between the anode 11 and the extraction electrode 13 to accelerate the ions.

The focusing electrode 14 is disposed between the cathode 12 and the extraction electrode 13 and acts to control the spatial profile of the ion beam IB which is a spatial distribution of the intensity of the ion beam IB.

The ion source 110 can produce the ion beam IB of uniform intensity by controlling the focusing voltage applied to the focusing electrode 14. That is, the ion source 110 can emit the ion beam IB whose intensity has a spatial profile close to that of a collimated beam.

Milling process conditions for the sample milling system 2 include the discharge voltage, the focusing voltage, and the flow rate of gas admitted into the ionization chamber.

Figure 25:
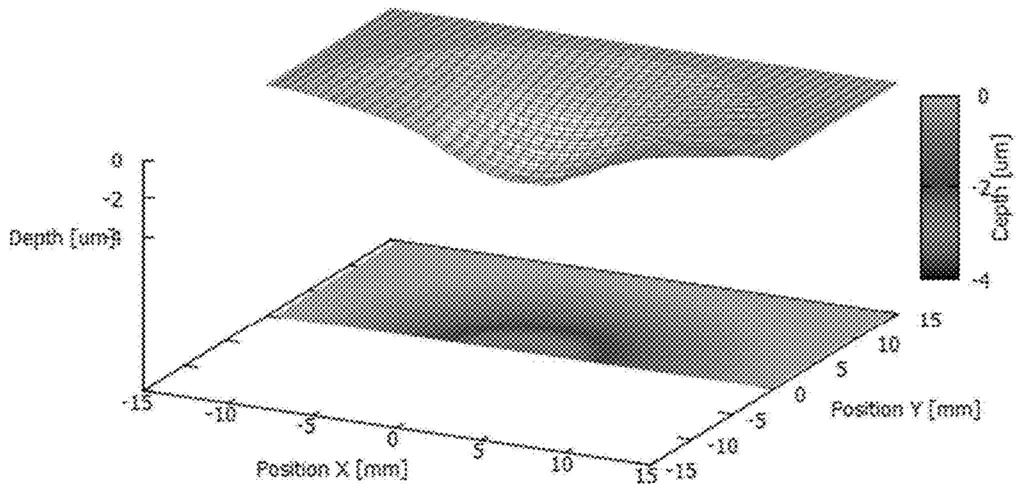
FIG. 25 shows one example of forecasted imagery.

FIG. 25 shows one example of forecasted imagery generated by the sample milling system 2 associated with the second embodiment. Because the ion source 110 produces the ion beam IB of uniform intensity, a wide area around the center of the sample S can be flattened. Also, a wide region on the sample can be milled.

Figure 26:
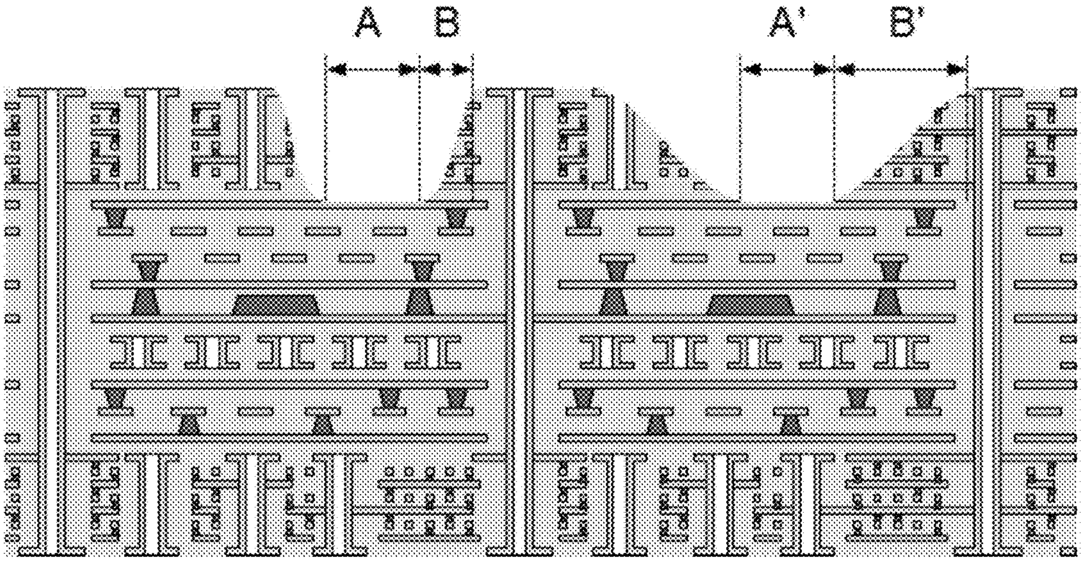
FIG. 26 schematically illustrates the manner in which a sample having a laminated layer structure is planar milled.

FIG. 26 schematically illustrates the manner in which the sample S having a laminated layer structure is planar milled, in which case planar milled regions and regions milled so as to taper off are formed on the sample S. In FIG. 26, regions A and A' have been planar milled. On the other hand, regions B and B' have been milled so as to taper off. Since the regions B and B' are different in taper angle, they provide different amounts of information. In particular, the region B' is smaller in taper angle than the region B and, therefore, the states of the various layers of the region B' can be checked.

Figure 27:
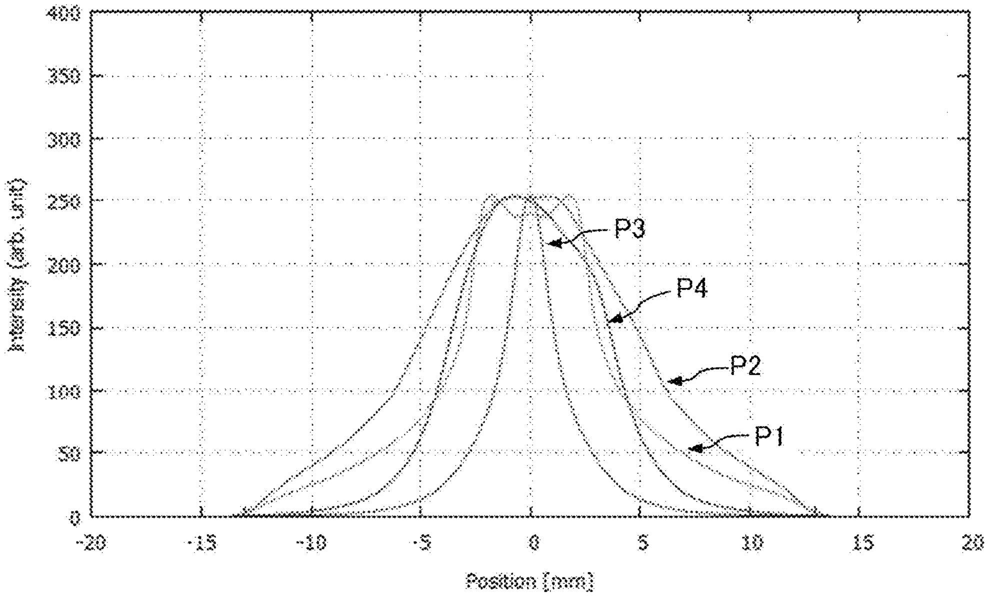
FIG. 27 shows another example of forecasted imagery.

FIG. 27 shows one example of forecasted imagery generated by the sample milling system 2 associated with the second embodiment. In FIG. 27, there are shown luminance profiles P1, P2, P3, and P4. The luminance profile P1 has been obtained using the focusing electrode 14 under milling process conditions: the intensity of the ion beam IB is uniform; the angle of impingement α of the ion beam IB is 80°; and there is no swing. The luminance profile P2 has been obtained using the focusing electrode 14 under milling process conditions: the intensity of the ion beam IB is uniform; the angle of impingement α of the ion beam IB is 80°; and the swing angle is from −30° to +30°. The luminance profile P3 has been obtained as one comparative example without using any focusing electrode under milling process conditions: the angle of impingement α of the ion beam IB is 80°; and there is no swing. The luminance profile P4 has been obtained as another comparative example without using any focusing electrode under milling process conditions: the angle of impingement α of the ion beam IB is 80°; and the swing angle is from −30° to +30°.

The differences of the tapering regions can be seen from the luminance profiles of FIG. 27. In particular, under the milling process conditions for the luminance profile P2, the taper angle is smaller as in the region B'.

3. Third Embodiment

Figure 28:
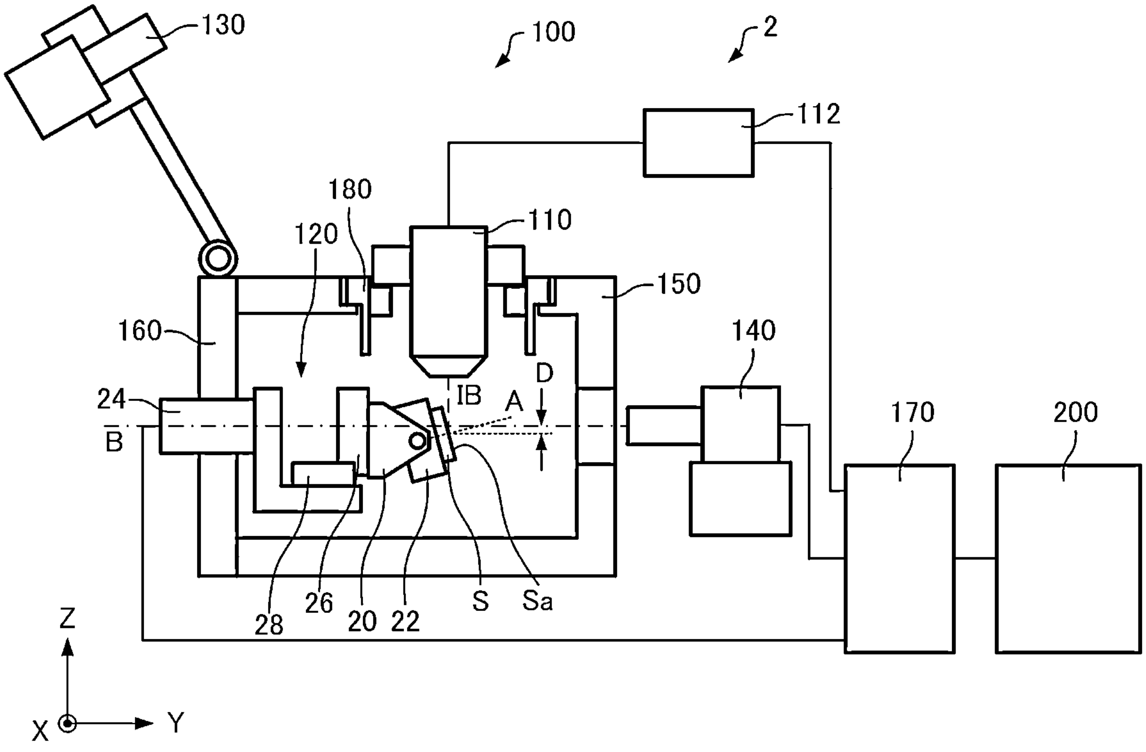
FIGS. 28 and 29 are diagrams of a sample milling system associated with a third embodiment, showing the configuration of the system.
Figure 29:
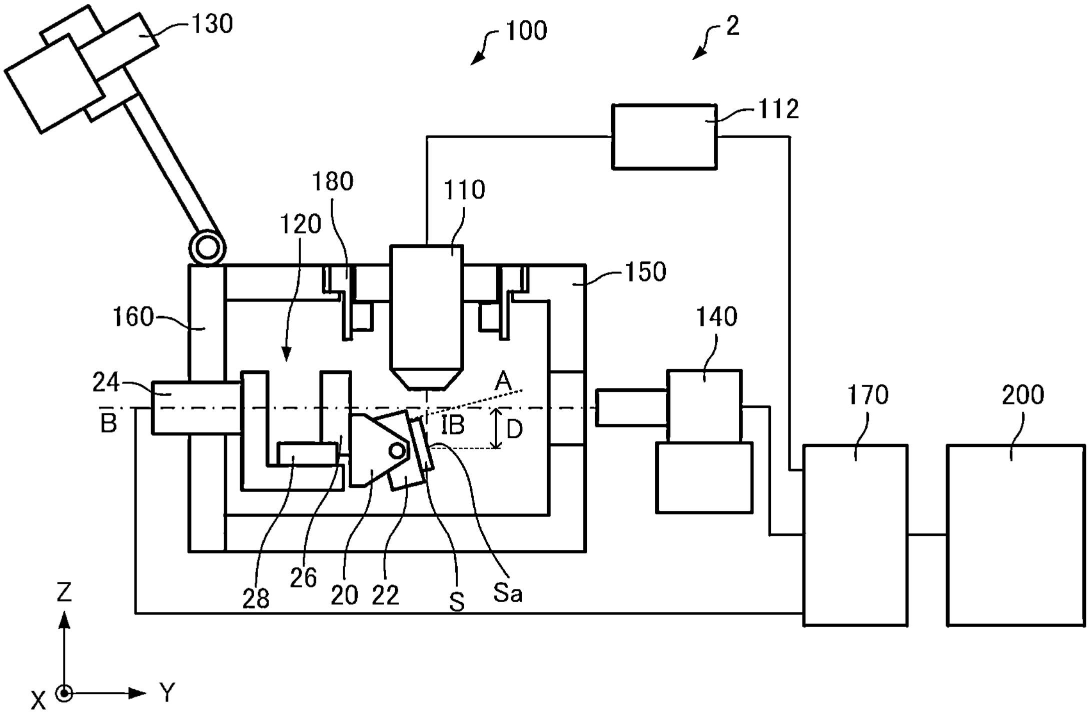

A sample milling system associated with a third embodiment is next described by referring to FIGS. 28 and 29, which show the configuration of the sample milling system, 2, associated with the third embodiment. Those members of this sample milling system 2 which are similar in function to their counterparts of the sample milling system 2 associated with the first embodiment are indicated by the same reference numerals as in the foregoing figures and a detailed description thereof is omitted below.

As shown in FIGS. 28 and 29, the sample milling apparatus 100 includes an ion source drive mechanism 180 for moving the ion source 110 in the Z direction. The distance between the ion source 110 and the sample S can be adjusted by moving the ion source 110 in the Z direction by means of the ion source drive mechanism 180. In FIG. 28, the ion source 110 is moved in the +Z direction, while in FIG. 29, the ion source 110 is moved in the −Z direction.

Figure 30:
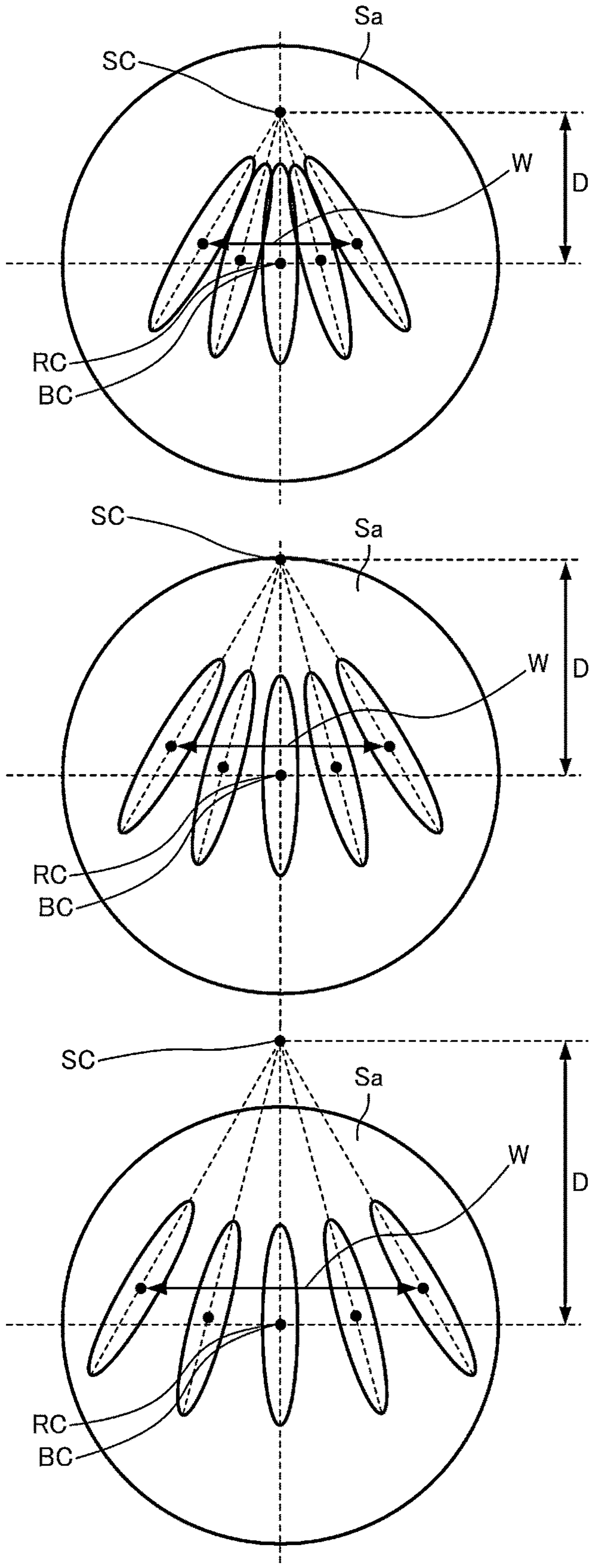
FIG. 30 illustrates the relationship of sample regions irradiated by an ion beam to the distance between the center of rotation and the center of swing of the sample.

FIG. 30 illustrates the relationship between the distance D between the center of rotation RC and the center of swing SC of the sample S and the range W irradiated with the ion beam IB. As shown, as the center-to-center distance D is increased, the range W irradiated with the beam IB increases in area.

However, if the center-to-center distance D is increased by moving the sample S in the −Z direction by the use of the Z stage 26 while the ion source 110 remains fixed, the distance between the ion source 110 and the sample S increases. This in turn reduces the intensity of the impingement of the ion beam IB, lowering the milling rate.

In the sample milling system 2, when the sample S is moved in the −Z direction by the Z stage 26 in order to increase the center-to-center distance D, the ion source 110 can be moved the same distance in the −Z direction by the ion source drive mechanism 180. Consequently, the center-to-center distance D can be increased without varying the distance between the sample S and the ion source 110.

In this way, in the sample milling system 2, the sample milling apparatus 100 includes the ion source drive mechanism 180 for moving the ion source 110 and so the center-to-center distance D can be varied without changing the distance between the sample S and the ion source 110.

4. Fourth Embodiment

Figure 31:
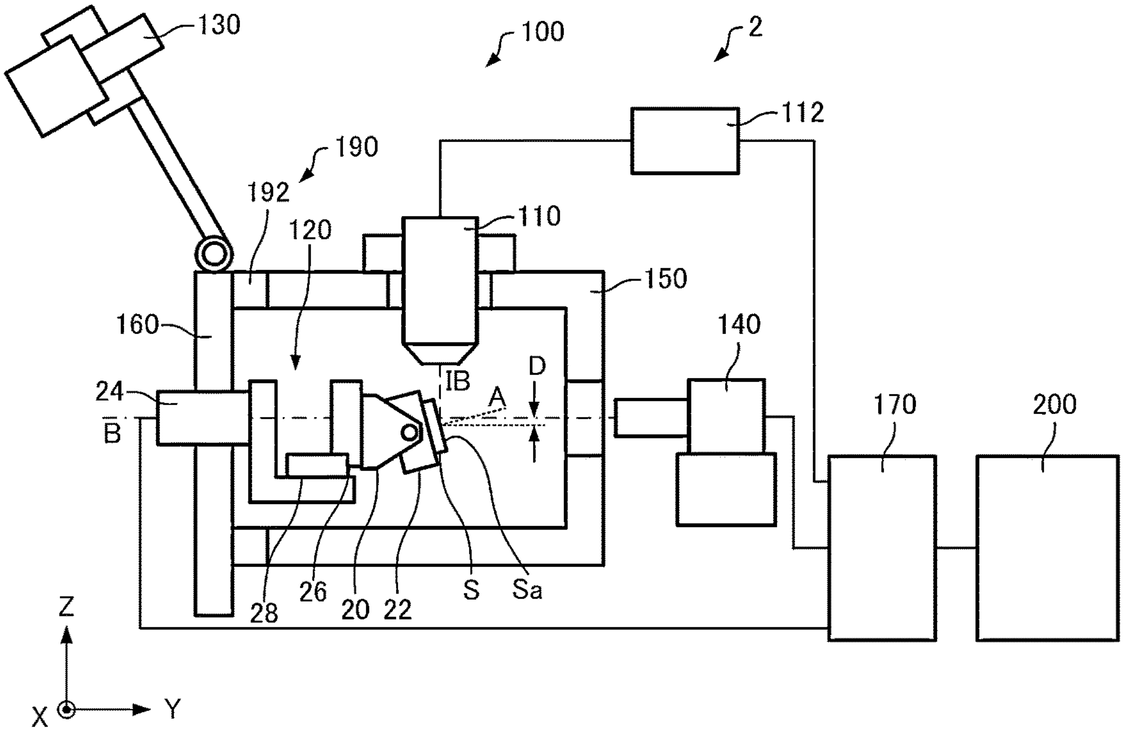
FIGS. 31 and 32 are diagrams of a sample milling system associated with a fourth embodiment, showing the configuration of the system.
Figure 32:
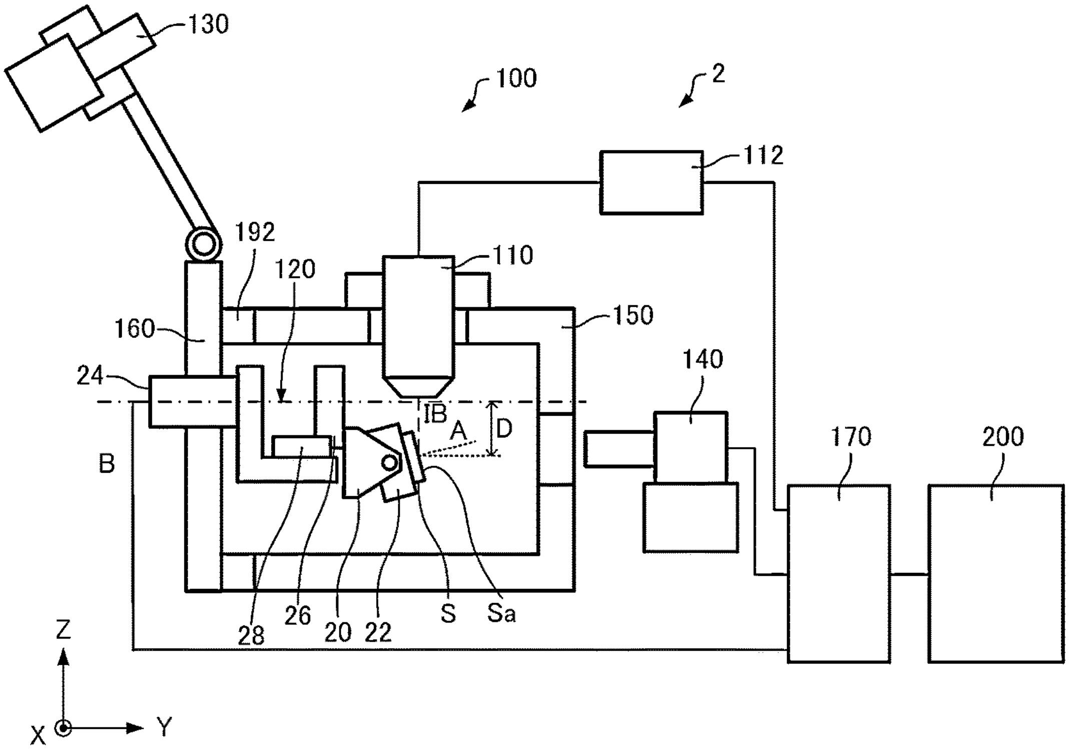

A sample milling system associated with a fourth embodiment is next described by referring to FIGS. 31 and 32, which show the configuration of the sample milling system 2 associated with the fourth embodiment. Those members of the sample milling system 2 associated with the fourth embodiment which are similar in function to their counterparts of the sample milling system 2 associated with the first embodiment are indicated by the same reference numerals as in the foregoing figures and a detailed description thereof is omitted below.

In the above-described sample milling system 2 associated with the third embodiment, as shown in FIGS. 29 and 30, the sample milling apparatus 100 includes the ion source drive mechanism 180 and so the center-to-center distance D can be varied without changing the distance between the sample S and the ion source 110.

In contrast, in the sample milling system 2 associated with the fourth embodiment, as shown in FIGS. 31 and 32, the sample milling apparatus 100 includes a swing drive mechanism 190 for moving the swing mechanism 24. Therefore, the center-to-center distance D can be varied without changing the distance between the sample S and the ion source 110.

The swing drive mechanism 190 includes the chamber door 160 and a flange 192 by which the door 160 is movably supported, the swing mechanism 24 being mounted to the chamber door 160. The flange 192 is secured to the chamber 150.

As shown in FIGS. 31 and 32, the chamber door 160 can move in the Z direction. For example, when the chamber door 160 is moved in the +Z direction, the swing mechanism 24 is moved in the +Z direction. Consequently, the distance D between the center of rotation RC and the center of swing SC of the sample S can be increased. At this time, the sample S is moved the same distance as the swing mechanism 24 in the −Z direction by the use of the Z stage 26. Thus, the center-to-center distance D can be increased without varying the distance between the sample S and the ion source 110.

In this way, the sample milling system 2 includes the swing drive mechanism 190 for moving the swing mechanism 24 and so the center-to-center distance D can be varied without modification to the distance between the sample S and the ion source 110.

5. Fifth Embodiment

Figure 33:
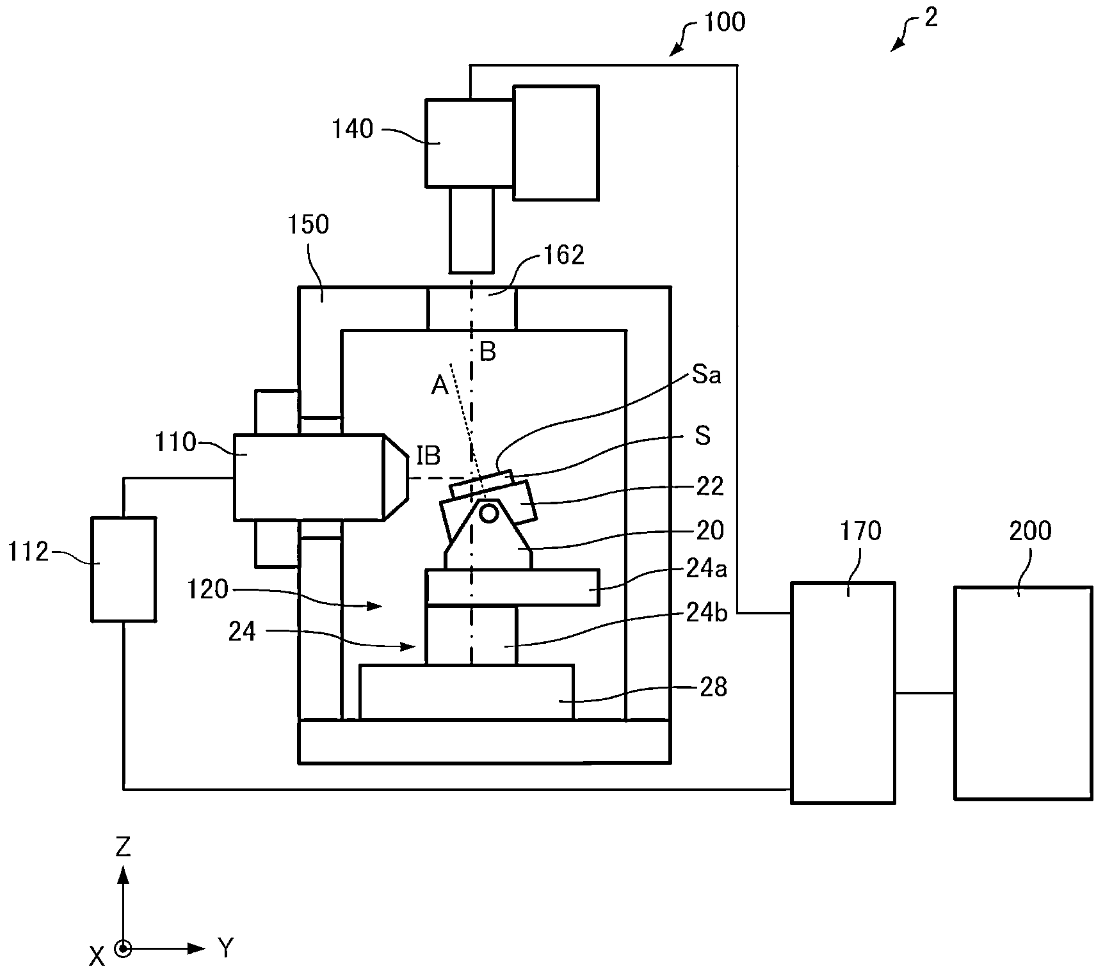
FIGS. 33 and 34 are diagrams of a sample milling system associated with a fifth embodiment, showing the configuration of the system.
Figure 34:
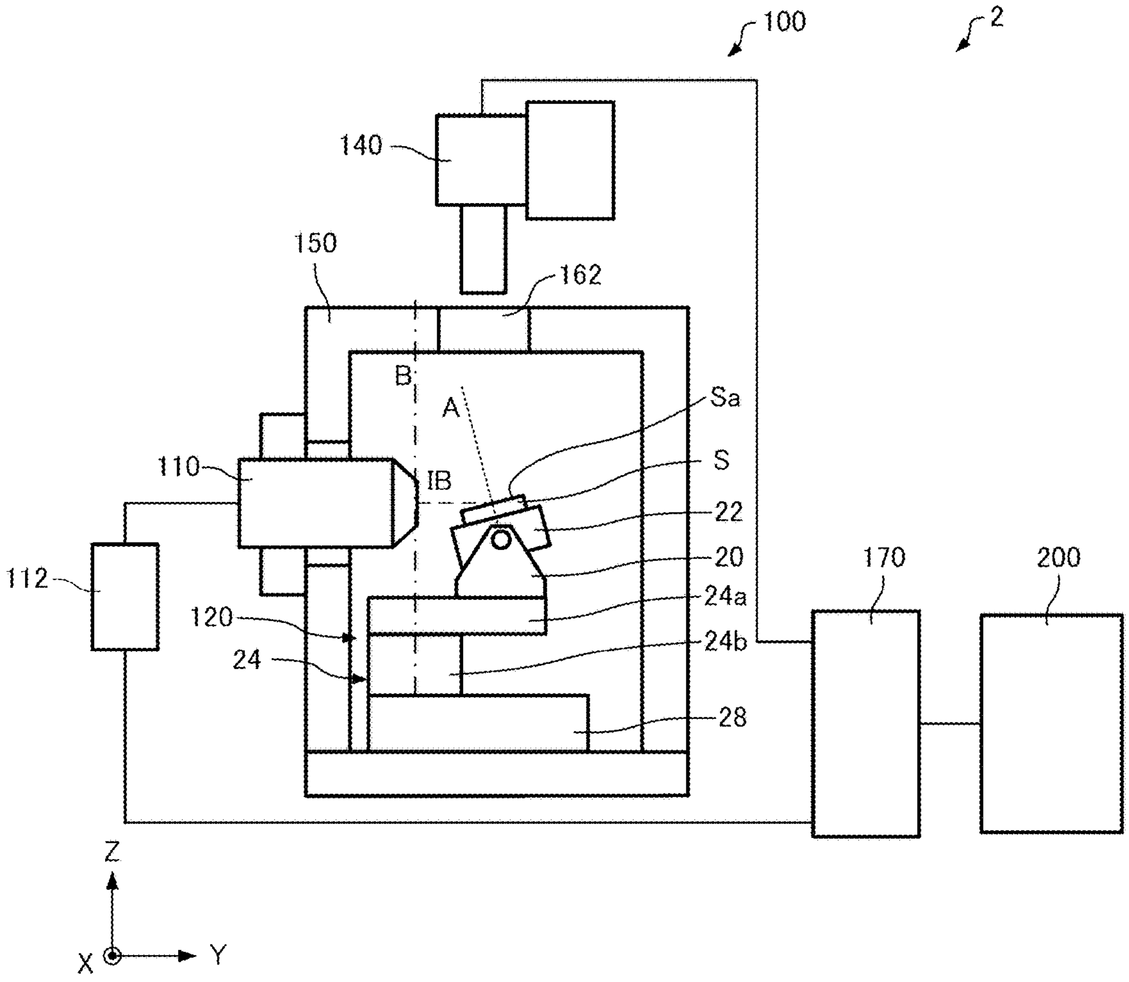

A sample milling system associated with a fifth embodiment is next described by referring to FIGS. 33 and 34, which show the configuration of a sample milling system, 2, associated with the fifth embodiment. Those members of this sample milling system 2 associated with the fifth embodiment which are similar in function to their counterparts of the sample milling system 2 associated with the first embodiment are indicated by the same reference numerals as in the above-cited figures and a detailed description thereof is omitted below.

In the sample milling system 2, as shown in FIGS. 33 and 34, the swing mechanism 24 includes the swing table **24*a* and the driver device 24*b* for swinging the swing table 24*a* and is disposed in the chamber 150. The swing mechanism 24 is placed on the XY stage 28**.

The driver device **24*b* can move on the XY stage 28 and thus can move the axis of swing B, so that the distance between the ion source 110 and the swing axis B can be adjusted. The driver device 24*b*** includes a vacuum motor, for example.

The tilt mechanism 20 is positioned on the swing table **24*a*. The rotary mechanism 22 to which the sample S is fastened is disposed on the tilt mechanism 20. The tilt mechanism 20 is designed to be capable of moving on the swing table 24*a* in the Y direction, whereby the distance between the ion source 110 and the sample S can be adjusted. In the sample milling system 2, the ion source 110 is mounted to the inner sidewall of the chamber 150** which is on the negative side of the Y axis.

The distance D between the swing center SC and the center of rotation RC is increased, for example, by moving the driver device **24*b* of the swing mechanism 24 in the −Y direction so that the swing axis B moves in the −Y direction. At this time, the sample S is moved the same distance as the swing axis B in the +Y direction by the use of the XY stage 28. Consequently, the center-to-center distance D can be increased without varying the distance between the sample S and the ion source 110**.

In this way, in the sample milling system 2, the swing mechanism 24 is capable of moving in the Y direction and, therefore, the center-to-center distance D can be varied without changing the distance between the sample S and the ion source 110.

6. Sixth Embodiment

6.1. Sample Milling System

Figure 35:
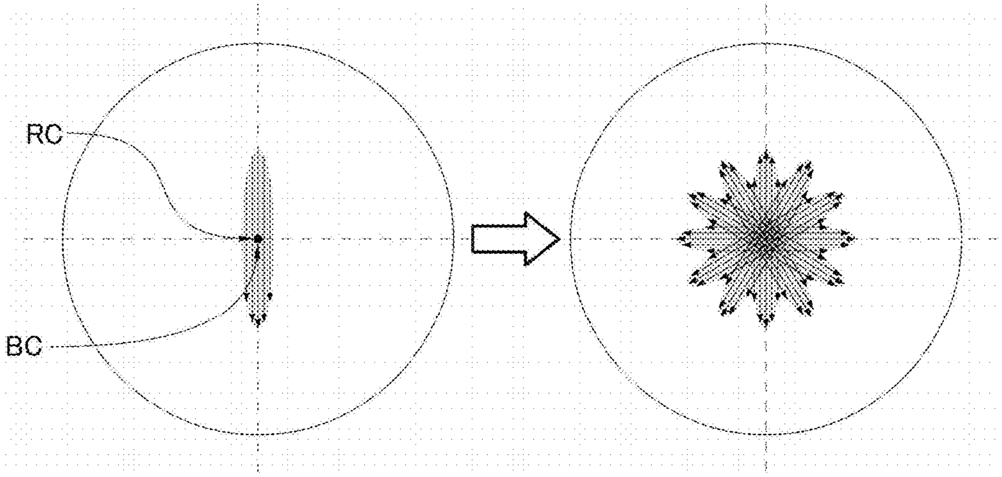
FIGS. 35-37 are impingement direction distribution images.
Figure 36:
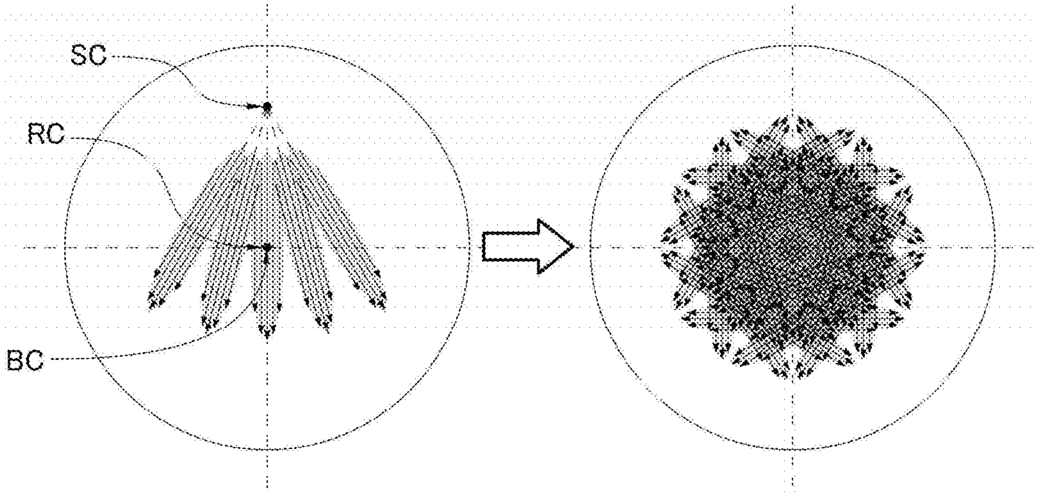
Figure 37:
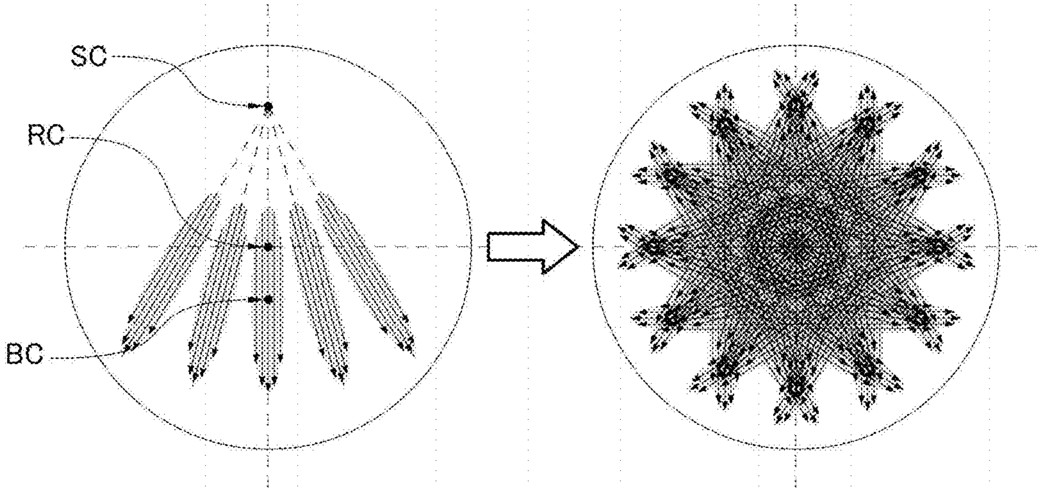

A sample milling system associated with a sixth embodiment is next described by referring to FIGS. 35-37. Since the sample milling system associated with the sixth embodiment is similar in configuration with the sample milling system 2 associated with the first embodiment and shown in FIGS. 1 and 2, a description thereof is omitted.

6.2. Method of Image Generation

In the above-described sample milling system 2 associated with the first embodiment, the impingement intensity distribution images of FIGS. 14 and 15 and the vector component distribution images of the ion beam IB shown in FIGS. 16 and 17 are generated as forecasted imagery by the image generator apparatus 200.

An impingement direction distribution image representing only a distribution of the intensity of the ion beam IB as taken in the direction of impingement may be generated as forecasted imagery by the image generator apparatus 200.

FIGS. 35-37 illustrate examples of impingement direction distribution image, as well as their process conditions. FIG. 35 shows an impingement direction distribution image for a case where the sample has been milled under milling process conditions including coincidence between the center of rotation RC and the center BC of the ion beam IB. FIG. 36 shows an impingement direction distribution image for a case where the sample has been milled under milling process conditions including coincidence between the center of rotation RC and the center BC of the ion beam IB and non-coincidence between the center of rotation RC and the swing center SC. FIG. 37 shows an impingement direction distribution image for a case where the sample has been milled under milling process conditions including non-coincidence between the center of rotation RC and the center BC of the ion beam IB and non-coincidence between the center of rotation RC and the swing center SC.

It is seen from the impingement direction distribution images of FIGS. 35-37 that a region irradiated with the ion beam IB from multiple directions can be widened by achieving non-coincidence between the center of rotation RC and the center BC of the ion beam IB and non-coincidence between the center of rotation RC and the swing center SC.

6.3. Processing Sequence for Image Generation

A processing sequence performed by the image generator apparatus 200 to generate images is described by referring to the flowchart of FIG. 23. In the following description, a processing sequence for generating impingement direction distribution images is described. A description of processing steps similar to those of the above-described processing for image generation is omitted.

First, the image generating section 212 acquires information about milling process conditions (S100). Then, the image generating section 212 acquires information about the ion beam IB (S102). For this purpose, the ion beam image Ib of FIG. 7 is obtained. It suffices herein to obtain information about the diameter of the beam from the ion beam image Ib. Accordingly, if information about the diameter of the ion beam IB is obtained as a milling process condition, then the ion beam image Ib does not need to be derived.

Then, the image generating section 212 operates so that an impingement direction distribution image at the first instant of time is generated as forecasted imagery at the first instant of time, based on the information about the process conditions and the ion beam IB (S104).

Figure 38:
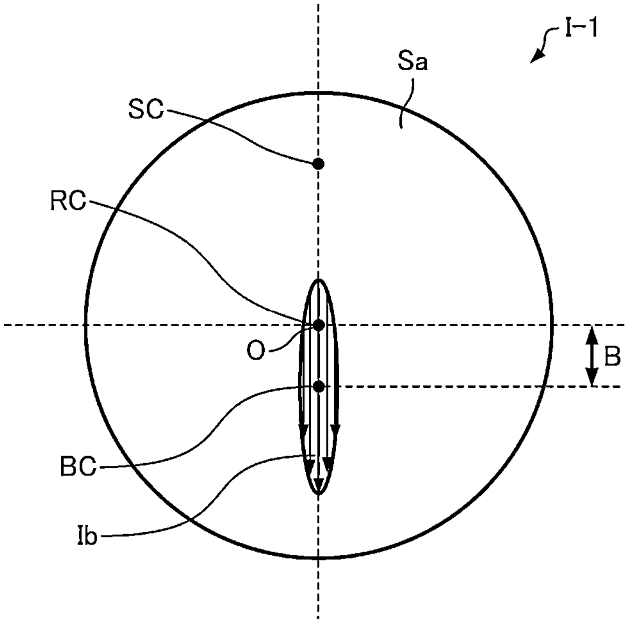
FIG. 38 schematically illustrates forecasted imagery at a first instant of time.

FIG. 38 schematically illustrates an image I-1 representing an impingement direction distribution occurring at the first instant of time. In the distribution image I-1 of FIG. 38, arrows indicating the direction of impingement of the ion beam IB at the first instant are drawn inside the contour of the ion beam IB. In this way, the impingement direction distribution image I-1 contains information about the directions of impingement of the ion beam IB but does not contain information about the intensity of the impingement of the beam IB.

Then, the image generating section 212 generates an image representing an impingement direction distribution at the mth instant of time based on the milling process conditions (S106).

Figure 39:
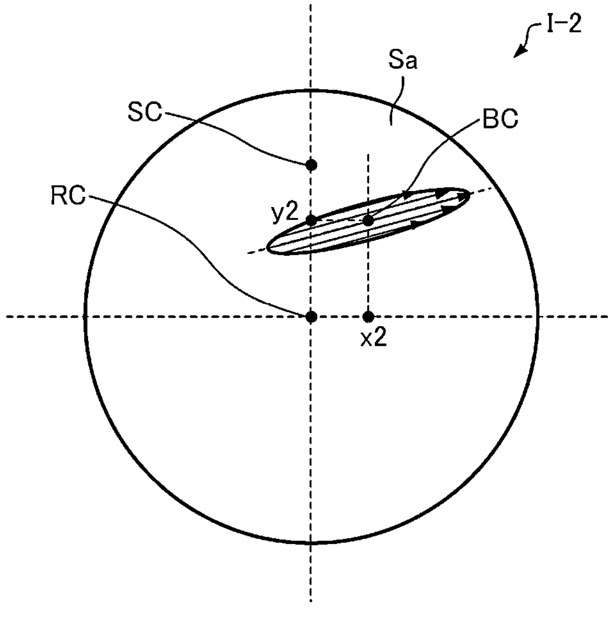
FIG. 39 schematically illustrates forecasted imagery at a second instant of time.

FIG. 39 schematically illustrates one example of image I-2 representing an impingement direction distribution at the second instant. The hit position of the ion beam IB and the direction of impingement at the second instant can be calculated in the same manner as the step S106 of the first embodiment described above.

Then, the image generating section 212 adds up the impingement direction distribution images I-1 and I-2 (S108). For example, these distribution images I-1 and I-2 are superimposed on top of each other. The image generating section 212 then makes a decision as to whether forecasted imagery for the nth instant has been generated (S110).

The image generating section 212 repeatedly performs the step S106 of generating an impingement direction distribution image for the mth instant, the step S108 of adding up the impingement direction distribution image at the mth instant and the impingement direction distribution image for the case where milling is done from the first instant to the (m−1)th instant, and the step of S110 of making a decision as to whether the impingement direction distribution image at the nth instant has been generated until the impingement direction distribution image at the nth instant is generated.

If the decision at step S110 is affirmative (Yes), indicating that the image generating section 212 has generated an impingement direction distribution image at the nth instant, the display control section 214 displays the generated impingement direction distribution image on the display section 230. In the displayed distribution image, directions of impingement are indicated by arrows as shown in FIGS. 35-37. Note that no restriction is imposed on the method of displaying directions of impingement. For example, directions of impingement may be displayed in colors. Owing to the processing steps described so far, impingement direction distribution images can be displayed for a case where a sample is milled under preset milling process conditions.

6.4. Advantageous Effects

In the sample milling system 2 associated with the sixth embodiment, forecasted imagery contains information about an impingement direction distribution of the ion beam IB emitted during milling and, therefore, it is possible to forecast where and in what directions milling stripes caused by milling occur on the sample S, in the same manner as the sample milling system 2 associated with the first embodiment.

7. Others

It is to be understood that the present invention is not restricted to the foregoing embodiments but rather can be implemented in variously modified forms without departing from the gist of the present invention. In the above-described first through sixth embodiments, the sample milling apparatus 100 rotates and swings the sample S. The operation of the sample milling apparatus 100 is not restricted to this. For example, the sample milling apparatus 100 may slide the sample S along one axis perpendicular to the optical axis of the ion beam IB while rotating the sample S. Furthermore, in the sample milling apparatus 100, the sample S may be moved along the X and Y axes perpendicular to the optical axis of the ion beam IB and the surface Sa of the sample S may be scanned with the ion beam IB.

Note that the foregoing embodiments and modifications are merely exemplary and that the present invention is not restricted thereto. For example, the embodiments and modifications can be combined appropriately.

It is to be understood that the present invention is not restricted to the embodiments described above and that the invention can be practiced in variously modified forms. For example, the present invention embraces configurations substantially identical to the configurations described in the embodiments. What are meant by substantially identical configurations are configurations identical in functions, method, and results or in purposes and effects, for example. Furthermore, the present invention embraces configurations which are similar to those described in the foregoing embodiments except that nonessential portions have been replaced. In addition, the present invention embraces configurations which are identical in yielded advantageous effects or achieved purposes to the configurations described in the foregoing embodiments. Further, the present invention embraces configurations similar to those described in the foregoing embodiments except that a well-known technique is added.

What is claimed is:

1. A sample milling system comprising:

a sample milling apparatus for milling a sample, the sample milling apparatus comprising:

a sample stage assembly including a tilt mechanism for tilting the sample and a rotary mechanism for rotating the sample; and at least one processor configured to:
cause an ion beam to impinge on the sample;
cause an image generator apparatus to:
generate forecasted imagery for a case where the sample is milled using the sample milling apparatus under preset milling process conditions, wherein, when generating the forecasted imagery, the at least one processor is configured to:
generate, based on the preset milling process conditions, a radial component image representing a distribution of intensity of components of the ion beam in a radial direction taken about a center of rotation of the sample;
generate, based on the preset milling process conditions, a rotational components image representing a distribution of intensity of components of the ion beam in a rotational direction taken about the center of rotation of the sample; and
generate the forecasted imagery by summing up, for each pair of corresponding pixels of the radial components image and the rotation component image, a luminance value of the radial component image and a luminance value of the rotation component image, taken as mutually different signs;
determine suitable milling process conditions for milling the sample based on said forecasted imagery; and
cause the sample milling apparatus to mill the sample based on the suitable milling process conditions.

2. The sample milling system as set forth in claim 1, wherein said sample milling apparatus comprises an ion source, and wherein the at least one processor is further configured to:
cause the at least one ion source to emit said ion beam at said sample;
cause the tilt mechanism to tilt the sample; and
cause the rotary mechanism to rotate the sample about the center of rotation of the sample, wherein said milling process conditions comprise a tilt angle and a rotational speed of the sample.

3. The sample milling system as set forth in claim 2, wherein said sample stage assembly comprises a swing mechanism, wherein the at least one processor is further configured to:
cause the swing mechanism to swing said sample about a center of swing of the sample which is different in position from the center of rotation of the sample, wherein said milling process conditions comprise a distance between the center of rotation of the sample and the center of swing of the sample.

4. The sample milling system as set forth in claim 3, wherein the distance between the center of rotation of said sample and the center of swing of said sample is variable.

5. The sample milling system as set forth in claim 2, wherein the distance between a center of said ion beam and the center of rotation of said sample as taken on the sample is variable, and wherein said milling process conditions comprise the distance between the center of the ion beam and the center of rotation of the sample.

6. The sample milling system as set forth in claim 2, wherein the at least one processor is further configured to:
cause said image generator apparatus to:
calculate directions of impingement of said ion beam at successive instants of time during milling based on said preset milling process conditions; and
create said forecasted imagery based on the directions of impingement of the ion beam at the successive instants of time.

7. The sample milling system as set forth in claim 6, wherein the at least one processor is further configured to:
cause said image generator apparatus to:
create vectors representing the directions and magnitudes of impingement of said ion beam at said successive instants of time;
resolve each of the vectors into a radial direction component and a rotational direction component about the center of rotation of the sample; and
generate said forecasted imagery based on the radial direction component and the rotational direction component at each of the successive instants of time such that the forecasted imagery contains information about a distribution of the intensity of the ion beam as taken in the radial direction and information about a distribution of the intensity of the ion beam as taken in the rotational direction.

8. The sample milling system as set forth in claim 1, wherein the at least one processor is further configured to:
cause said image generator apparatus to display said forecasted imagery and imagery of said sample in an unmilled state superimposed.

9. The sample milling system as set forth in claim 1, wherein the at least one processor is further configured to:
cause said image generator apparatus to provide a color representation of the directions of impingement of said ion beam in said forecasted imagery.

10. The sample milling system as set forth in claim 1, wherein said forecasted imagery contains information about a distribution of the magnitude of the impingement of said ion beam.

11. The sample milling system as set forth in claim 2, wherein said forecasted imagery contains information about a distribution of the magnitude of impingement of said ion beam as taken in a radial direction defined about the center of rotation of the sample and information about a distribution of the magnitude of impingement of the ion beam as taken in a rotational direction defined about the center of rotation of the sample.

12. An image generator apparatus comprising at least one processor, the at least one processor configured to:
generate forecasted imagery for a case where a sample is milled under preset milling process conditions using a sample milling apparatus that mills the sample by making an ion beam impinge on the sample, wherein the sample milling apparatus comprises a sample stage assembly including a tilt mechanism for tilting the sample and a rotary mechanism for rotating the sample, wherein, when generating the forecasted imagery, the at least one processor is configured to:
generate, based on the preset milling process conditions, a radial component image representing a distribution of intensity of components of the ion beam in a radial direction taken about a center of rotation of the sample;
generate, based on the preset milling process conditions, a rotational components image representing a distribution of intensity of components of the ion beam in a rotational direction taken about the center of rotation of the sample; and
generate the forecasted imagery by summing up, for each pair of corresponding pixels of the radial components image and the rotation component image, a luminance value of the radial component image and a luminance value of the rotation component image, taken as mutually different signs;

display the forecasted imagery;

determine suitable milling process conditions for milling the sample based on the forecasted imagery; and mill the sample based on the suitable milling process conditions.

13. A sample milling system comprising:

a sample milling apparatus for milling a sample, the sample milling apparatus comprising:

a sample stage assembly including a tilt mechanism for tilting the sample, a rotary mechanism for rotating the sample, and a swing mechanism for swinging the sample; and at least one processor configured to:

cause an ion beam to impinge on the sample;

cause an image generator apparatus to:

generate forecasted imagery for a case where the sample is milled using the sample milling apparatus under preset milling process conditions, wherein the preset milling process conditions include a tilt angle of the sample, a rotational speed of the sample, and a distance between a center of rotation of the sample and a center of swing of the sample, wherein when generating the forecasted imagery, the at least one processor is configured to:

generate, based on the preset milling process conditions, an impingement direction distribution image representing a direction of impingement of the ion beam at each instant of time; and generate the forecasted imagery by summing up the impingement direction distribution images at each instant of time;

determine suitable milling process conditions for milling the sample based on said forecasted imagery; and cause the sample milling apparatus to mill the sample based on the suitable milling process conditions.

* * * * *